US011113361B2

(12) United States Patent
Park et al.

(10) Patent No.: US 11,113,361 B2
(45) Date of Patent: Sep. 7, 2021

(54) ELECTRONIC APPARATUS AND CONTROL METHOD THEREOF

(71) Applicant: SAMSUNG ELECTRONICS CO., LTD., Suwon-si (KR)

(72) Inventors: Younghwan Park, Suwon-si (KR); Kyounghoon Kim, Suwon-si (KR); Dongkwan Suh, Suwon-si (KR); Hansu Cho, Suwon-si (KR); Keshava Prasad Nagaraja, Suwon-si (KR); Sukjin Kim, Suwon-si (KR); Hyunjung Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 162 days.

(21) Appl. No.: 16/295,599

(22) Filed: Mar. 7, 2019

(65) Prior Publication Data

US 2019/0278828 A1 Sep. 12, 2019

(30) Foreign Application Priority Data

Mar. 7, 2018 (KR) .................. 10-2018-0026882

(51) Int. Cl.
G06F 17/15 (2006.01)
H03M 7/30 (2006.01)
H03K 19/20 (2006.01)

(52) U.S. Cl.
CPC .......... *G06F 17/153* (2013.01); *H03K 19/20* (2013.01); *H03M 7/30* (2013.01)

(58) Field of Classification Search
CPC .................................................. G06F 17/153
See application file for complete search history.

(56) References Cited

U.S. PATENT DOCUMENTS 8,442,927 B2    5/2013   Chakradhar et al.
2007/0271325 A1 11/2007  Juffa et al.
(Continued)

FOREIGN PATENT DOCUMENTS

JP     2015-210747 A    11/2015
KR  10-2017-0052432 A    5/2017
(Continued)

OTHER PUBLICATIONS

Albericio, et al., "Cnvlutin: Ineffectual-Neuron-Free Deep Neural Network Computing", Jun. 2016, ISCA 2016, pp. 1-13.
(Continued)

*Primary Examiner* — Chuong D Ngo
(74) *Attorney, Agent, or Firm* — Sughrue Mion, PLLC

(57) ABSTRACT

An electronic apparatus is provided. The electronic apparatus includes a storage storing object data and kernel data, and a processor including a plurality of processing elements arranged in a matrix formation, wherein the processor is configured to input corresponding first elements among a plurality of first elements included in the object data into processing elements arranged in a first row among the plurality of processing elements, and input a plurality of second elements included in the kernel data sequentially into the processing elements arranged in the first row to perform operations between the corresponding first elements and the plurality of second elements, to identify a depth in which a first element and a second element have a non-zero value, and to input the first element and the second element corresponding to the identified depth into a calculator included in each of the processing elements arranged in the first row to perform a convolution operation.

17 Claims, 56 Drawing Sheets

(56) References Cited

U.S. PATENT DOCUMENTS

| | | | |
|---|---|---|---|
| 2010/0106947 | A1 | 4/2010 | Moloney |
| 2013/0073599 | A1 | 3/2013 | Maloney |
| 2015/0134583 | A1 | 5/2015 | Tamatsu et al. |
| 2016/0328644 | A1 | 11/2016 | Lin et al. |
| 2016/0358069 | A1* | 12/2016 | Brothers ............... G06F 7/764 |
| 2017/0103313 | A1 | 4/2017 | Ross et al. |
| 2017/0236053 | A1 | 8/2017 | Lavigueur et al. |
| 2018/0046906 | A1 | 2/2018 | Dally et al. |
| 2018/0218518 | A1* | 8/2018 | Yan ..................... G06N 3/063 |
| 2019/0114542 | A1 | 4/2019 | Kim et al. |

FOREIGN PATENT DOCUMENTS

| | | | |
|---|---|---|---|
| KR | 10-2019-0041388 | A | 4/2019 |
| WO | 2016/154440 | A1 | 9/2016 |
| WO | 2019/074185 | A1 | 4/2019 |

OTHER PUBLICATIONS

Du, et al., "ShiDianNao: Shifting Vision Processing Closer to the Sensor", Jun. 2015, ISCA 2015, pp. 92-104.

Han, et al., "EIE: Efficient Inference Engine on Compressed Deep Neural Network", Jun. 2016, ISCA 2016, 12 pages total.

International Search Report (PCT/ISA/210) dated Jun. 25, 2019, issued by International Searching Authority in corresponding International Application No. PCT/KR2019/002668.

Written Opinion (PCT/ISA/237) dated Jun. 25, 2019, issued by the International Searching Authority in corresponding International Application No. PCT/KR2019/002668.

Kim et al., "A Novel Zero Weight/Activation-Aware Hardware Architecture of Convolutional Neural Network" 2017 Design, Automation and Test in Europe (DATE), IEEE, Mar. 2017, XP055761039, 6 pages.

Kim et al., "ZeNA: Zero-Aware Neural Network Accelerator", IEEE Design & Test, Hardware Accelerators for Data Centers, Feb. 2, 2018, XP011676668, pp. 39-46 (8 pages).

Parashar et al., "SCNN: An Accelerator for Compressed-sparse Convolutional Neural Networks", 2017 Association for Computing Machinery, Toronto Canada, Jun. 24, 2017, XP033268524, DOI: 10.1145/3079856.3080254, 14 pages.

Communication dated Jan. 18, 2021 by the European Patent Office in corresponding European Application No. 19764062.6.

\* cited by examiner

FIG. 1B

Output

| | col1 | col2 | col3 |
|---|---|---|---|
| row1 | Out11 | Out12 | Out13 |
| row2 | Out21 | Out22 | Out23 |
| row3 | Out31 | Out32 | Out33 |

Feature Map

S0:

S1:

PE00

PE01

PE02

PE03

PE10

PE11

PE12

PE13

PE20

PE21

PE22

PE23

PE30

PE31

PE32

PE33

S2:

PE00

PE01

PE02

PE03

PE10

PE11

PE12

PE13

PE20

PE21

PE22

PE23

PE30

PE31

PE32

PE33

S3:

S4:

S5:

S6:

S7:

S1:

S6:

S7:

S8:

S9:

S10:

S11:

S12:

S13:

S15:

ELECTRONIC APPARATUS AND CONTROL METHOD THEREOF

CROSS-REFERENCE TO RELATED APPLICATIONS

This application is based on and claims priority under 35 U.S.C. § 119 to Korean Patent Application No. 10-2018-0026882, filed on Mar. 7, 2018, in the Korean Intellectual Property Office, the disclosure of which is incorporated by reference herein in its entirety.

BACKGROUND

1. Field

The disclosure relates to an electronic apparatus and a controlling method thereof, and more particularly, to an electronic apparatus for performing a convolution operation and a controlling method thereof.

The disclosure also relates to an artificial intelligence (AI) system that simulates functions, such as recognition and judgment, of a human brain using a machine learning algorithm and its application.

2. Description of the Related Art

Recently, artificial intelligence systems that implement artificial intelligence (AI) have been used in various fields. An artificial intelligence system is a system in which the machine learns, judges and becomes smart, unlike a conventional rules-based smart system. The more the artificial intelligence system is used, the higher the recognition rate and the better the understanding of a user's preferences.

Artificial intelligence technology consists of machine learning (e.g., deep-learning) and element technologies that use machine learning.

Machine learning is an algorithm technology that classifies/trains the characteristics of input data by itself. Element technology is a technology that simulates functions, such as recognition and judgment of the human brain, using a machine learning algorithm such as deep learning and includes linguistic understanding, visual understanding, reasoning/prediction, knowledge representation, motion control, etc.

Artificial intelligence technology may be applied to various fields, examples of which are described below. Linguistic understanding is a technology for recognizing and applying/processing human language/characters, including natural language processing, machine translation, dialogue system, query response, speech recognition/synthesis, and the like. Visual comprehension is a technology for recognizing and processing an object as if perceived by a human being, including object recognition, object tracking, image search, human recognition, scene understanding, spatial understanding, image enhancement, etc. Inference prediction is a technology for judging and logically inferring and predicting information, including knowledge/probability-based reasoning, optimization prediction, preference-bases planning, and recommendations. Knowledge representation is a technology for automating human experience information into knowledge data, including knowledge building (data generation/classification) and knowledge management (data utilization). Motion control is a technology for controlling the autonomous movements of a device or object, e.g., travel of a vehicle and the motion of a robot, including motion control (navigation, collision and traveling), operation control (behavior control), and the like.

Furthermore, a convolution neural network (CNN) has a structure suitable for learning two-dimensional (2D) data or three-dimensional (3D) data, and can be trained through a backpropagation algorithm. The CNN has been widely used in various applications such as object classification, object detection, etc., of an image.

In this case, most operations of the CNN are convolution operations, and the convolution operations are mostly defined by multiplications between input data. However, object data (e.g., image data) and kernel data, which are input data, may include a plurality of zeros, and in this case, it is unnecessary to perform a multiplication.

For example, if at least one of input data is 0 (zero) in a multiplication between input data, the multiplication result would be 0 (zero). In other words, if at least one of input data is 0 (zero), a user may know that the multiplication result will be 0 (zero) before performing the multiplication. In this case, the number of operation cycles may be reduced by omitting an unnecessary multiplication; such a process is referred to as data sparsity processing.

However, related art methods processes data sparsity in a state in which a plurality of processing elements are in the form of a one-dimensional array. The related art methods do not process data sparsity in a state in which a plurality of processing elements are in the form of a two-dimensional array.

SUMMARY

Provided are an electronic apparatus for increasing an operation speed by omitting an unnecessary operation during a convolution operation and a controlling method thereof.

In accordance with an aspect of the disclosure, an electronic apparatus includes: a storage configured to store object data and kernel data; and a processor including a plurality of processing elements arranged in a matrix formation, wherein the processor is configured to: input corresponding first elements, among a plurality of first elements included in the object data, respectively into processing elements arranged in a first row among the plurality of processing elements, input a plurality of second elements, included in the kernel data, sequentially into the processing elements arranged in the first row to perform operations between the corresponding first elements and the plurality of second elements, compare, through a logic circuit included in each of the processing elements arranged in the first row, the corresponding first elements and the plurality of second elements input to the processing elements arranged in the first row by depth, identify a depth in which a first element and a second element, among the compared corresponding first elements and the plurality of second elements input to the processing elements arranged in the first row, have a non-zero value, and input the first element and the second element corresponding to the identified depth into a calculator included in each of the processing elements arranged in the first row to perform a convolution operation.

In accordance with another aspect of the disclosure, a controlling method for an electronic apparatus including a storage for storing object data and kernel data, and a processor including a plurality of processing elements arranged in a matrix formation, includes: inputting corresponding first elements, among a plurality of first elements included in the object data, respectively to processing elements arranged in a first row among the plurality of processing elements; inputting a plurality of second elements, included in the kernel data, sequentially into the processing elements arranged in the first row; comparing, through a logic circuit included in each of the processing elements arranged in the first row, the corresponding first elements with the plurality of second elements input to the processing elements arranged in the first row by depth; identifying a depth in which a first element and a second element, among the compared corresponding first elements and the plurality of second elements input to the processing elements arranged in the first row, have a non-zero value; and inputting the first element and the second element corresponding to the identified depth into a calculator included in each of the processing elements arranged in the first row to perform a convolution operation.

In accordance with another aspect of the disclosure, a non-transitory computer-readable recording medium having recorded thereon a program executable by a computer for performing the method.

In accordance with another aspect of the disclosure, an electronic apparatus includes: a storage storing instructions; and at least one processor including a plurality of processing elements, the at least one processor configured to execute the instructions to: input corresponding first elements, among a plurality of first elements included in object data, respectively into processing elements arranged in a first row among the plurality of processing elements, input a plurality of second elements, included in kernel data, sequentially into the processing elements arranged in the first row, compare the corresponding first elements and the plurality of second elements input to the processing elements arranged in the first row by depth, identify a depth in which a first element and a second element, among the compared corresponding first elements and the plurality of second elements input to the processing elements arranged in the first row, have a non-zero value, and perform a convolution operation with respect to the first element and the second element corresponding to the identified depth.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 1A and 1B are views to explain a convolution operation between three-dimensional input data;

DETAILED DESCRIPTION

Figure 1A:
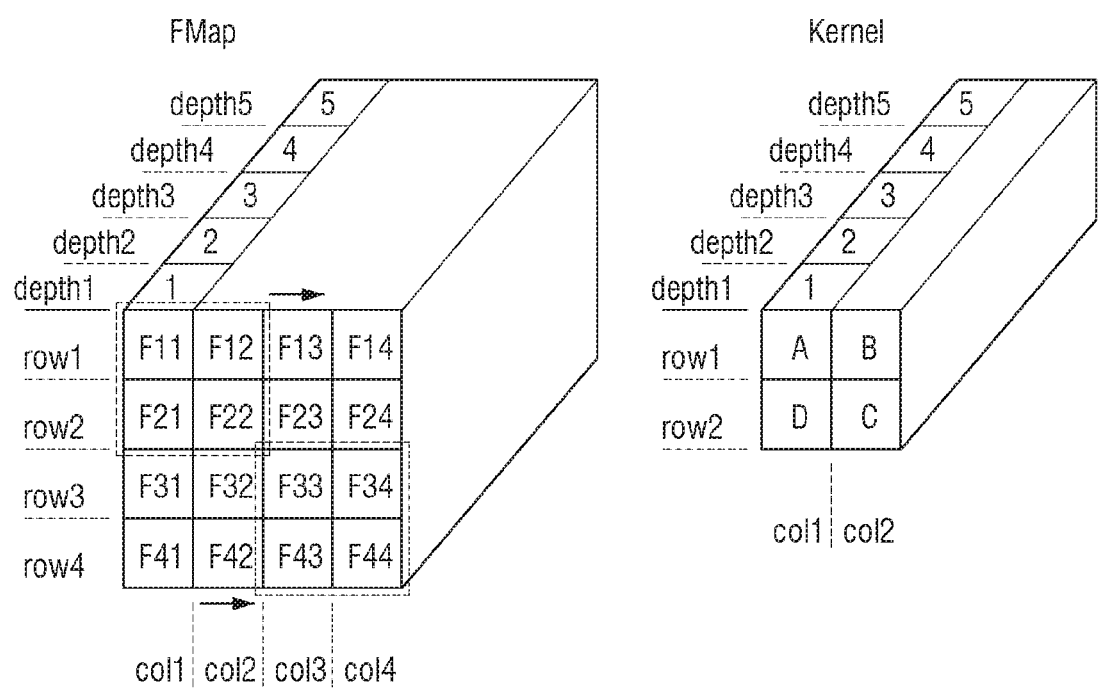

The terms used in this specification, including technical and scientific terms, have the same meanings as would be generally understood by those skilled in the relevant art. However, these terms may vary depending on the intentions of the person skilled in the art, legal or technical interpretation, and the emergence of new technologies. In addition, some terms are arbitrarily selected by the applicant. These terms may be construed per the meaning defined or described herein and, unless otherwise specified, may be construed on the basis of the entire contents of this specification and common technical knowledge in the art.

The disclosure is not limited to an embodiment disclosed below and may be implemented in various forms. In other words, the scope of the disclosure is not limited to the following embodiments. In addition, all changes or modifications derived from the meaning and scope of the claims and their equivalents should be construed as being included within the scope of the disclosure. In the following description, a configuration that is publicly or well known or may be derived from the disclosure may be omitted.

Terms such as "first," "second," and so on may be used to describe a variety of elements, but the elements should not be limited by these terms. The terms are used simply to distinguish one element from other elements. The use of such ordinal numbers should not be construed as limiting the meaning of the term. For example, the components associated with such an ordinal number should not be limited in the order of use, placement order, or the like. If necessary, each ordinal number may be used interchangeably.

Further, it is understood that a singular expression also includes the plural meaning where not contrary to the context. In this specification, terms such as "include" and "have"/"has" should be construed as designating that there are such features, numbers, operations, elements, components or a combination thereof in the specification, not to exclude the existence or possibility of adding one or more of other features, numbers, operations, elements, components or a combination thereof.

In an exemplary embodiment, "a module," "a unit," or "a part" performs at least one function or operation, and may be realized as hardware, such as a processor or integrated circuit, software that is executed by a processor, or a combination thereof. In addition, a plurality of "modules," a plurality of "units," or a plurality of "parts" may be integrated into at least one module or chip and may be realized as at least one processor except for "modules," "units" or "parts" that should be realized in a specific hardware.

Hereinafter, embodiments will be described in detail with reference to the accompanying drawings so that those skilled in the art can easily carry out the disclosure. However, the disclosure may be embodied in many different forms and is not limited to the embodiments described herein. In order to clearly illustrate the disclosure in the drawings, some of the elements that are not essential to the complete understanding of the disclosure may be omitted, and like reference numerals refer to like elements throughout the specification.

In the disclosure, expressions such as "at least one of a, b or c" and "a, b, and/or c" means only a, only b, only c, both a and b, both a and c, both b and c, all of a, b, and c, or variations thereof.

Hereinafter, the disclosure will be described in greater detail with reference to drawings attached herein.

FIGS. 1A and 1B are views to explain a convolution operation between three-dimensional (3D) input data and are provided to facilitate understanding of the disclosure. The convolution operation may be performed frequently in deep-learning, and an operation for highlighting characteristics corresponding to kernel data from object data through the operation between the object data and the kernel data.

FIG. 1A illustrates an example of three-dimensional feature map data on the left and an example of three-dimensional kernel data on the right. Referring to FIG. 1A, the object data may be three-dimensional data in 4 (four) rows, 4 (four) columns, and 5 (five) depths, and the kernel data may be three-dimensional data in 2 (two) rows, 2 (two) columns, and 5 (five) depths.

FIG. 1B shows output data based on a convolution operation between object data and kernel data. The output data may be two-dimensional data in 3 (three) rows and 3 (three) columns.

Out11 of the output data may be calculated by the following equation.

$$Out11 = F11,1 \times A,1 + F11,2 \times A,2 + F11,3 \times A,3 + F11,4 \times A, \\ 4 + F11,5 \times A,5 + F12,1 \times B,1 + F12,2 \times B,2 + F12,3 \times B, \\ 3 + F12,4 \times B,4 + F12,5 \times B,5 + F21,1 \times D,1 + F21,2 \times D, \\ 2 + F21,3 \times D,3 + F21,4 \times D,4 + F21,5 \times D,5 + F22,1 \times C, \\ 1 + F22,2 \times C,2 + F22,3 \times C,3 + F22,4 \times C,4 + F22,5 \times \\ C,5$$

The characters to the left of the comma of F11,1 (i.e., "11") may indicate the row and the column of object data, and the character to the right of the comma of F11,1 (i.e., "1") may indicate the depth of the object data. For example, F21,3 may indicate the second row, the first column, and the third depth (e.g., depth unit) of object data. The other object data is similarly expressed. The character to the left of the comma of A,1 (i.e., "A") may indicate the row and the column of kernel data, and the character to the right of the comma of A,1 (i.e., "1") may indicate the depth of the kernel data. For example, D,4 may indicate the second row, the first column, and the fourth depth of kernel data. The other kernel data is similarly expressed. Hereinafter, for ease of explanation, the above-described expressions will be used, though it is understood that other embodiments are not limited thereto and other expression formats may be used.

The output data may be similarly calculated by the operations between other rows and columns of the same kernel data and object data. For example, Out23 of the output data may be calculated by the operations between data included in all depths of F23, F24, F33 and F34 of the object data and the kernel data.

As described above, the depth of three-dimensional input data may need to be the same to perform a convolution operation between three-dimensional input data. Although the input data is three-dimensional data, output data may be provided as two-dimensional data.

FIG. 1B illustrates the result obtained by omitting operations of the outer pixels of object data, and output data of other types may be generated as operations on the outer pixels are added.

In the above description, the concept of a convolution operation between three-dimensional input data has been described. It is understood that various methods of the convolution operation can be implemented in hardware.

Hereinafter, for convenience of explanation, data of all depths constituting object data such as [F11,1], [F11,2], [F11,3], [F11,4], [F11,5], [F21,1] . . . , [F44,4] and [F44,5] will be referred to as first elements, and data of all depths constituting kernel data such as [A,1], [A,2], [A,3], [A,4], [B,1], . . . , [C,4], [D,1], [D,2], [D,3] and [D,4] will be referred to as second elements. Therefore, the first elements included in the first row and the first column of the object data may include all elements corresponding to [F11,1], [F11,2], [F11,3], [F11,4], and [F11,5], and the second elements included in the first row and the first column of the kernel data may include all elements corresponding to [A,1], [A,2], [A,3], [A,4] and [A,5]. Further, the reference directions of the row, column and depth shown in FIG. 1A and FIG. 1B are the same in the following drawings.

Figure 2:
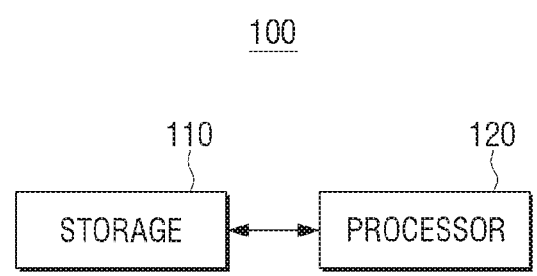
FIG. 2 is a block diagram illustrating configuration of an electronic apparatus according to an embodiment.

FIG. 2 is a block diagram illustrating configuration of an electronic apparatus 100 according to an embodiment.

Referring to FIG. 2, an electronic apparatus 100 may include a storage 110 and a processor 120.

The electronic apparatus 100 may perform deep-learning. The electronic apparatus 100 may be an apparatus that performs a convolution operation. For example, the electronic apparatus 100 may be a desktop personal computer (PC), a laptop, a smartphone, a table PC, a work station, a mobile device, a portable device, a server, etc. The electronic apparatus 100 may be a system itself in which a cloud computing environment is established. However, the disclosure is not limited thereto, and the electronic apparatus 100 could be any type of apparatus that performs a convolution operation.

The storage 110 may store object data and kernel data. The object data and the kernel data may be stored to correspond to the format of the storage 110. For example, the storage 110 may include a plurality of cells in two dimensions, and the object data and the kernel data in three dimensions may be stored in a plurality of cells in two dimensions.

The processor 120 may identity data stored in the plurality of cells in two dimensions as three-dimensional object data and kernel data. For example, the processor 120 may identify data stored in the first to twenty-fifth cells among the plurality of cells as data in the first depth of the object data, and data stored in the twenty-sixth to fiftieth cells among the plurality of cells as data in the second depth of the object data.

The kernel data may be generated by the electronic apparatus 100, or generated and received from an external electronic device rather than the electronic apparatus 100. The object data may be data received from the external electronic device.

The storage 110 may be implemented as a hard disk drive (HDD), a solid state drive (SSD), a DRAM memory, an SRAM memory, a FRAM memory, and/or a flash memory.

The processor 120 may control the overall operations of the electronic apparatus 100.

According to an embodiment, the processor 120 may be implemented as a digital signal processor (DSP), a microprocessor, or a time controller (TCON), but is not limited thereto. The processor 120 may include one or more central processing unit (CPU), a microcontroller unit (MCU), a micro processing unit (MPU), a controller, an application processor (AP), a communication processor (CP), an ARM processor, and the like, or may be defined by the corresponding terms. The processor 120 may be implemented as a system on chip (SoC), a large scale integration (LSI) with a built-in processing algorithm, and/or in the form of a field programmable gate array (FPGA).

The processor 120 may include a plurality of processing elements in a matrix formation, and control the operations of the plurality of processing elements.

Figure 3:
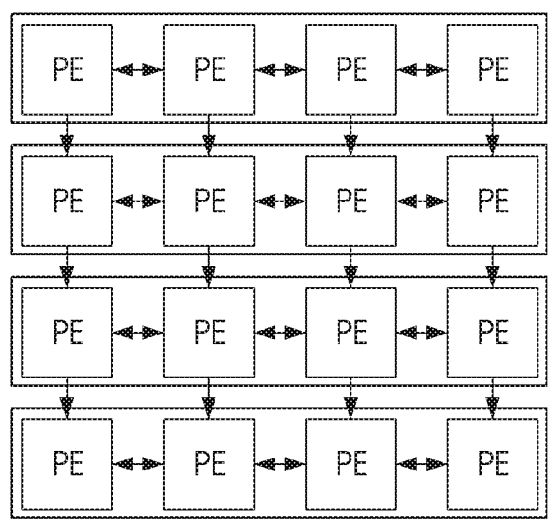
FIG. 3 is a view illustrating a plurality of processing elements according to an embodiment.

For example, referring to FIG. 3, the plurality of processing elements may be arranged in a matrix formation, and data may be shared between neighboring processing elements. FIG. 3 shows that data is transmitted from top to bottom, but is not limited thereto. For example, according to another embodiment, the data may be transmitted from bottom to top.

Each of the plurality of processing elements may include a multiplier and an Arithmetic Logic Unit (ALU), and the ALU may include at least one adder. Each of the plurality of processing elements may perform an arithmetic operation by using the multiplier and the ALU. Further, each of the plurality of processing elements may include a plurality of buffers.

The processor 120 may input a plurality of first elements included in object data into the plurality of processing elements, respectively. The processor 120 may identify a corresponding processing element among the plurality of processing elements based on row information and column information of a first element of the object data, and input the first element into the identified processing element.

For example, when the first element corresponds to the first row and the first column of the object data, the processor 120 may input the first element into the processing element in the first row and the first column among the plurality of processing elements. Similarly, when the first element is in the second row and the second column of the object data, the processor 120 may input the first element into the processing element in the second row and the second column among the plurality of processing elements. The first element in the first row and the first column of the object data may include a plurality of elements (or "sub elements," "positions," or "depths") of different depths, and the processor 120 may input the first element (i.e., the plurality of elements of different depths) in the first row and the first column of the object data into the buffer of the processing element in the first row and the first column of the plurality of processing elements.

The processor 120 may sequentially input a plurality of second elements included in kernel data into a plurality of respective first processing elements in the first row among the plurality of processing elements.

The processor 120 may sequentially input the plurality of second elements included in the kernel data stored in the storage 100 into the plurality of respective first processing elements. The sequential input operation refers to the input order of the plurality of second elements. For example, for the second element of the first depth, the second element of the second depth, and the second element of the third depth of the kernel data, the processor 120 may input the second element of the first depth into each of the plurality of first processing elements in the first cycle, the second element of the second depth into each of the plurality of first processing elements in the second cycle following the first cycle, and the second element of the three depth into each of the plurality of first processing elements in the third cycle following the second cycle.

The plurality of first processing elements in the first row among the plurality of processing elements may be a plurality of processing elements arranged at the edge of one side in the matrix of the plurality of processing elements. For example, the plurality of first processing elements may be 5 (five) processing elements disposed at the uppermost side of FIG. 3.

The processor 120 may sequentially input the second elements to the plurality of respective first processing elements based on the row information and the column information of the second element of the kernel data.

The processor 120 may sequentially input the second elements in one row and one column into the plurality of respective first processing elements. When all the second elements in one row and one column of the kernel data are input into the plurality of respective first processing elements, and the operations on the plurality of first processing elements are completed, the second elements in other rows and columns of the kernel data may be input into the plurality of respective first processing elements.

For example, the processor 120 may sequentially input the data in which the second elements in the first row and the first column are arranged in the order of depth in kernel data into the plurality of respective first processing elements. In this case, when the operations on the second elements in the first row and the first column in the plurality of first processing elements are completed, the processor 120 may sequentially input data in which the second elements in the first row and the second column are arranged in the order of depth into the plurality of respective first processing elements.

The processor 120 may input one second element into each of the plurality of first processing elements, and when the cycle is changed, may input the following second element into each of the plurality of first processing elements.

Each of the plurality of first processing elements may perform the operation between the input first and second elements based on the input depth information of the first elements and the input depth information of the second elements.

Each of the plurality of first processing elements may transmit the result of the operation between the first element and the second element to the neighboring processing element. The convolution operation between the first element and the second element may be performed in such a manner that the resultant value calculated by each of the plurality of first processing elements may be transmitted to the neighboring processing element and summed.

Each of the plurality of first processing elements may shift the calculation value obtained by multiplying the first element and the second element, both of which have the same depth respectively in the object data and the kernel data, in a predetermined direction, and perform accumulation on the operation value between neighboring processing elements, to thereby perform a convolution operation between the first and second elements input to the plurality of respective first processing elements. The accumulated operation value between the neighboring processing elements may be stored in the buffer included in each processing element.

Each of the plurality of processing elements may perform an operation between the first element and the second element by 1 (one) cycle per 1 (one) depth based on the respective depth information.

The first elements of the object data may be pre-input into a plurality of processing elements at once, and the second elements of the kernel data may be sequentially input to the plurality of respective processing elements. Each of the processing elements may perform the operations between the pre-stored first elements and the input second elements based on the respective depth information, and when the operations on the plurality of processing elements are all completed, the second elements in the following order may be input to the plurality of respective processing elements.

Figure 4:
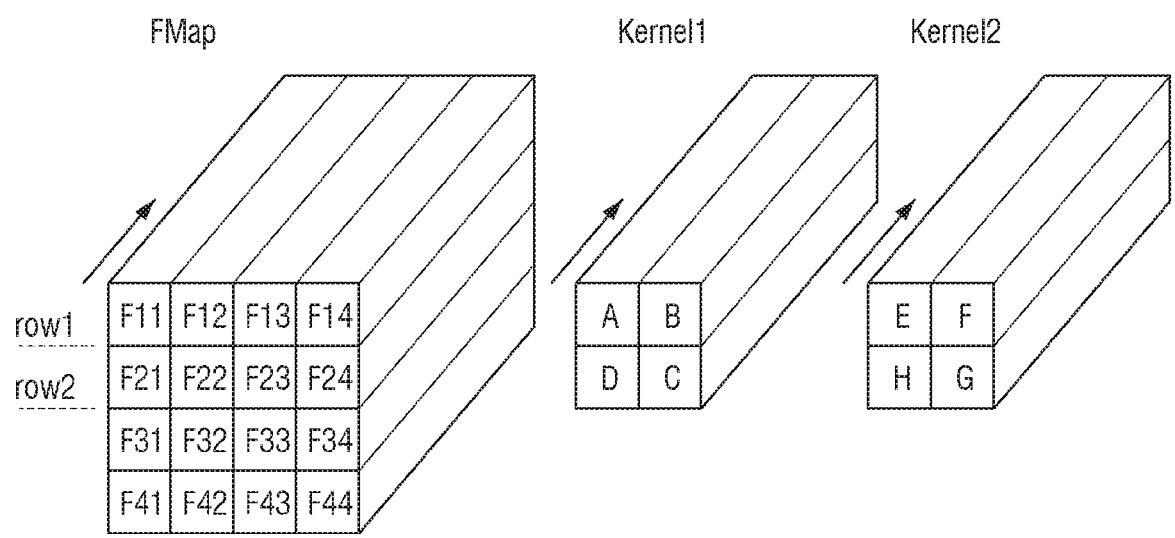
FIG. 4 is a view illustrating object data and kernel data according to an embodiment.

As described above, the processor 120 may perform a convolution operation between object data and kernel data. Hereinafter, a method for increasing the operation efficiency by removing an unnecessary operation by sparsity of object data and kernel data in the operation of the processor 120 according to an embodiment will be described. For ease of explanation, 4×4 object data and 2×2 kernel data will be exemplified as shown in FIG. 4, although it is understood that one or more other embodiments are not limited thereto.

The First Example Embodiment

Figure 5:
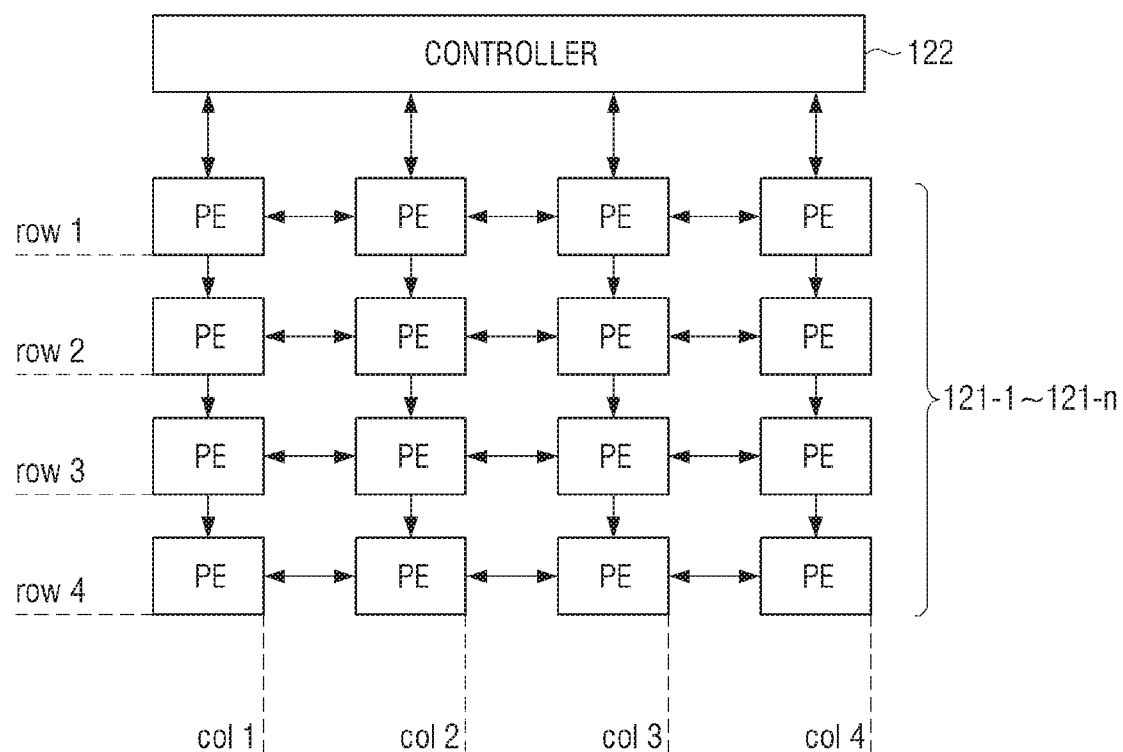
FIG. 5 is a block diagram illustrating a configuration of a processor according to an embodiment.

FIG. 5 is a block diagram illustrating configuration of a processor 120 according to an embodiment.

The processor 120 may include a plurality of processing elements 121-1 to 121-n, and a controller 122. FIG. 5 shows 16 processing elements for ease of explanation, and it is understood that more or less than 16 processing elements may be included in one or more other embodiments.

The plurality of processing elements 121-1 to 121-n may be arranged in a matrix formation, and FIG. 5 shows an example of the arrangement of a 4×4 matrix formation.

The controller 122 may control the plurality of processing elements 121-1 to 121-n. The controller 122 may input object data and kernel data into the plurality of processing elements 121-1 to 121-n, and control the processing operations of the plurality of processing elements 121-1 to 121-n.

Figure 6A:
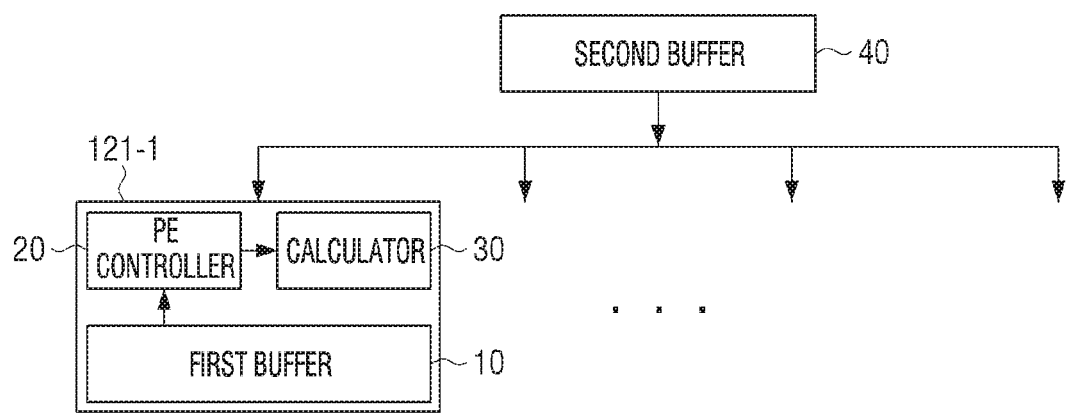
FIG. 6A is a block diagram illustrating a configuration of a processing element according to another embodiment.

Referring to FIG. 6A, the plurality of processing elements 121-1 to 121-n may include a first buffer 10, a PE controller 20, a calculator 30, and a second buffer 40.

The first buffer 10 may store the first elements corresponding to the plurality of respective processing elements 121-1 to 121-n among the plurality of first elements included in the object data. The first elements may be data including the values of all depths, and the method for inputting the first elements into the first buffer 10 is described in detail below with reference to FIG. 10.

The second buffer 40 may temporarily store kernel data to be input to the plurality of processing elements 121-1 to 121-n. The second buffer 40 may temporarily store at least one second element among the plurality of second elements constituting the kernel data. The second elements may be data including the values of all depths. According to the present embodiment, the second buffer 40 may be provided in each row of the plurality of processing elements 121-1 to 121-n to transmit each different second element of the kernel data to the processing element in each row of the plurality of processing elements 121-1 to 121-n.

Every time the operation of inputting the second element to each processing element in the first row of the plurality of processing elements 121-1 to 121-n is completed, other second elements of the kernel data may be sequentially stored in the second buffer 40.

The second buffer 40 may further store a bitmap indicating whether the second element stored in the second buffer 40 has a zero-value or a non-zero value on a depth basis.

For example, the second buffer 40 may store data of all depths of element A in the first row and the first column of the first kernel (Kernel1) shown in FIG. 4. In addition, the second buffer 40 may store a bitmap indicating whether element A has a zero value or a non-zero value for each depth. For example, when the depth value of element A (i.e., the number of depth units for element A) is 8, and element A has a zero-value in depths 2, 4 and 7, then the stored bitmap of element A may be 10101101.

When the operation by element A is completed in all processing elements included in the first row of the plurality of processing elements 121-1 to 121-n, the second buffer 40 may store data of all depths of element B in the first row and the second column of the first kernel together with the bitmap of element B.

Figure 6B:
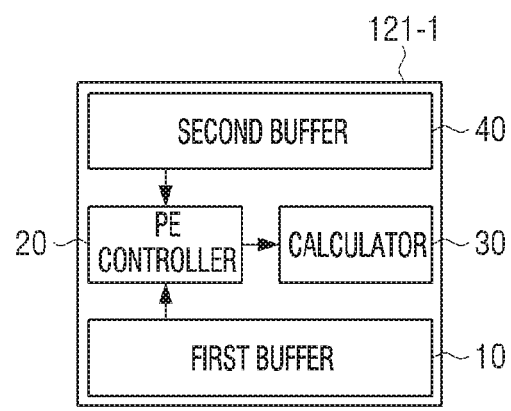
FIG. 6B is a block diagram illustrating a configuration of a processing element according to another embodiment.

Referring to FIG. 6B, according to another embodiment, the second buffer 40 may be included in each of the plurality of processing elements 121-1 to 121-n. Such a structure of the processing element is particularly useful in the embodiments shown in FIGS. 13, 14, and 15A to 15O, detailed descriptions of which are provided below.

The PE controller 20 may include a plurality of logic circuits, receive first elements from the first buffer 10 and second elements from the second buffer 40, transmit the first and second elements to the plurality of logic circuits, transmit output values from the plurality of logic circuits to the calculator 30, and control to perform a convolution operation on object data and kernel data.

The plurality of logic circuits may filter the first and second elements to be input to the calculator 30 among the first elements stored in the first buffer and the second elements stored in the second buffer 10 and 40.

For example, the plurality of logic circuits may include more than the number of logic gates corresponding to the depth of the first element of the object data, and filter a non-zero element of the kernel data and the object data through the logic gate. A detailed operation of the logic gate will be described below.

The controller 122 may compare the first element of the object data input to the first butter 10 of the plurality of processing elements 121-1 to 121-n with the second element stored in the second buffer 40 for each depth through a filtering operation by the plurality of logic circuits, identify depths in which the first and second elements both have a non-zero value, and input the first and second elements corresponding to the identified depths into the calculator 30 included in each of the processing elements in the first row. The calculator 30 may perform a convolution operation between the input first and second elements. According to the above-described operation, the filtering operation of the object data may be performed by the kernel data.

The calculator 30 may include a pair of a multiplier and an Arithmetic Logic Unit (ALU), and the ALU may include at least one adder. The calculator 30 may perform a convolution operation by using the multiplier and the ALU.

Hereinafter, a detailed description of an embodiment is provided.

Figure 7A:
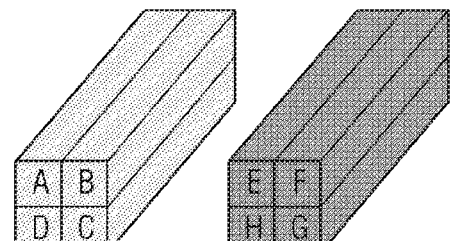
FIGS. 7A and 7B are views to explain a method for inputting kernel data for a plurality of processing elements according to an embodiment.
Figure 7A:
Figure 7A:
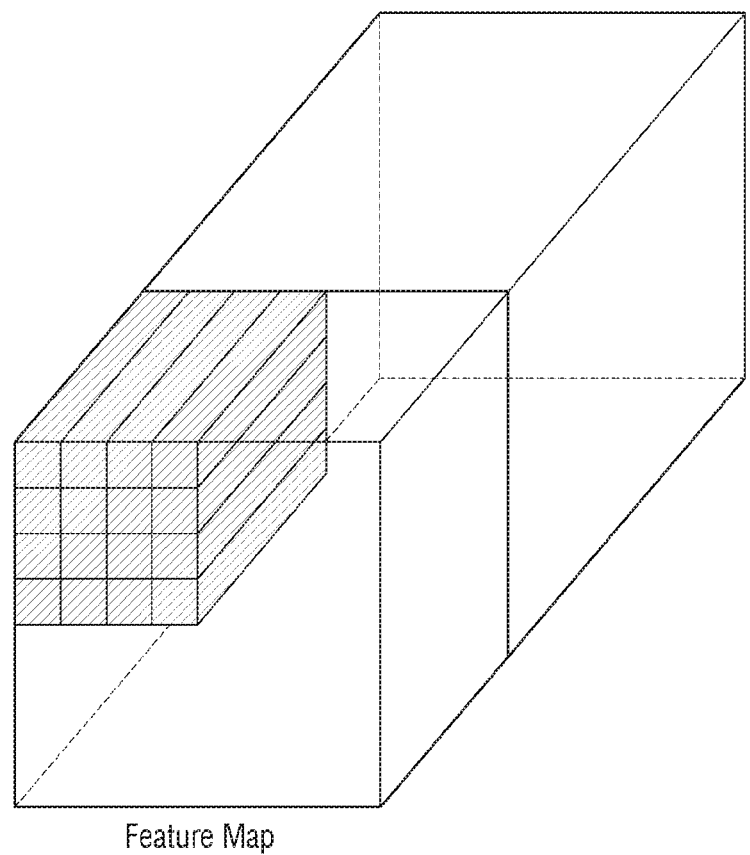
Figure 7B:
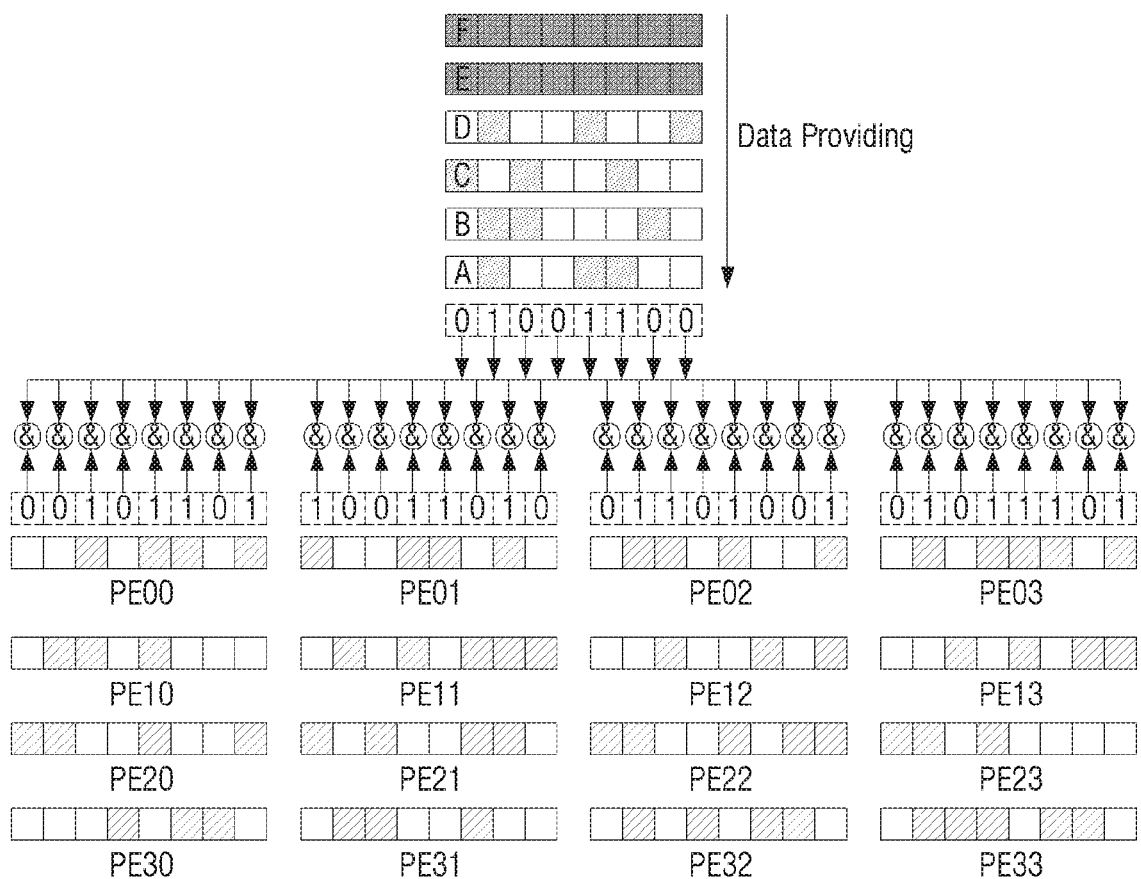

FIGS. 7A and 7B are views to explain a method for inputting kernel data for a plurality of processing elements according to an embodiment.

FIG. 7A is a schematic view illustrating filtering of a feature map, which is object data, by performing a convolution operation by the first kernel and the second kernel, according to an embodiment.

The feature map may include a first element of 4 (row)×4 (column), and each first element may have a depth of 8 (eight). The first kernel (Kernel1) may include second elements (A to D elements) of 2 (row)×2 (column), and each second element may have a depth of 8 (eight). The second kernel (Kernel2) may include second elements (E to H elements) of 2 (row)×2 (column), and each second element may have a depth of 8 (eight).

Filtering by the first kernel and the second kernel may be sequentially performed in the feature map.

FIG. 7B shows a method for inputting each element of the first kernel and the second kernel into a plurality of processing elements sequentially in detail, according to an embodiment.

A plurality of processing elements PE00 to PE33 may be arranged in a matrix formation as shown in FIG. 7B, and each of elements A, B, C and D of the kernel data and the second buffer 40 for storing the bitmap for each of the elements A, B, C and D may be provided in each row of the plurality of processing elements PE00 to PE33.

The second element A constituting the first kernel may be stored in the second buffer 40 corresponding to the first row of the plurality of processing elements, and the controller 122 may input the bitmap "01001100" of the second element A stored in the second buffer 40 into each of the first processing elements PE00 to PE03 in the first row.

The bitmap indicating whether the plurality of first elements respectively pre-stored in the plurality of first processing elements PE00 to PE03 in the first row of the plurality of processing elements are zero or non-zero by depth may be stored in the first buffer 10 included in each of the plurality of first processing elements PE00 to PE03.

Hereinafter, for ease of explanation, the bitmap of the first elements will be referred to as the first bitmap, and the bitmap of the second elements will be referred to as the second bitmap.

The controller 122 may input the first bitmaps of the first elements stored in the first buffer 10 of each of the plurality of first processing elements PE00 to PE03, and the second bitmap of the second element A stored in the second buffer 40 into the PE controller 20 included in each of the first processing elements PE00 to PE03.

The PE controller 20 may include a plurality of logic circuits, and the logic circuit, referring to FIG. 7B, may be embodied as a gate to perform an AND operation (hereinafter, referred to as AND gate). FIG. 6B illustrates the AND gate as "&" for each.

The first and second bitmaps may be input to the AND gates included in the PE controller 20. The plurality of AND gates included in the first processing elements PE00 to PE03 may output the values obtained by comparing the bitmap "01001100" of the second element A with the bitmaps "00101101," "10011010" and "01101001" of the first elements, and transmit the values to the calculator 30 included in the first processing elements PE00 to PE03.

Specifically, the AND gate included in each of the first processing elements PE00 to PE03 may compare the bitmap "01001100" of the second element A with "00101101," "10011010," "01101001" and "01011101" of the first elements pre-stored in the first buffers 10 of the first processing elements PE00 to PE03 by depth. When there is a non-zero value at the same position on the respective arrays of two bitmaps to be compared, the AND gate may output value '1' only in the corresponding position, and the PE controller 20 may control to input only the value of the depth corresponding to the position from which the value '1' is output into the calculator 30.

The operation of the AND gate in each cycle is described in detail below with reference to FIGS. 8A to 8D.

FIGS. 8A to 8D are views to explain a method for processing and operating sparsity of object data and kernel data according to an embodiment. Hereinafter, the logic circuits of the PE controller 20 included in the respective first processing elements PE00 to PE03 will be referred to as LC1, LC2, LC3 and LC4.

Figure 8A:
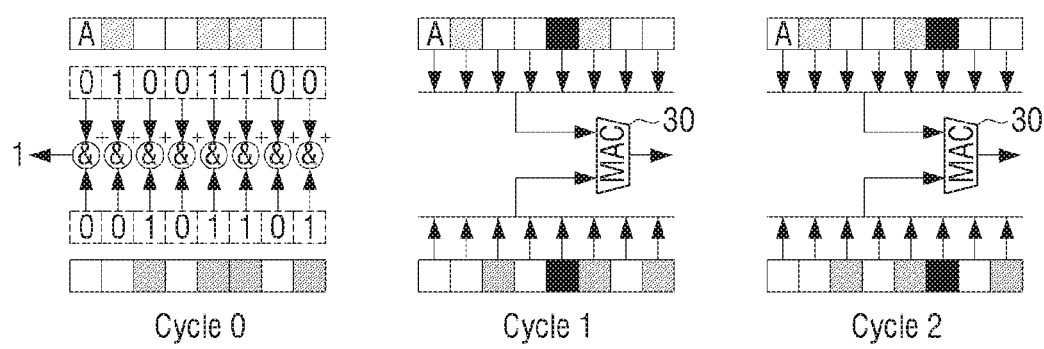
FIGS. 8A to 8D are views to explain a method for processing and operating sparsity of object data and kernel data according to an embodiment.

As shown in FIG. 8A, LC1 may identify positions having a value of "1" on respective arrays of the first bitmap "00101101" and the second bitmap "01001100" input to the PE00 ("1" in the fifth, and "1" in the sixth from the left). The PE controller 20 may identify a first non-zero element and a second non-zero element at the fifth position in the first and second bitmaps and a first non-zero element and a second non-zero element at the sixth position in the first and second bitmaps. In this case, the PE controller 20 may control to input only the identified first and second non-zero elements into the calculator 30 through a multiplexer.

In the first cycle (cycle 1) of PE00, the first and second non-zero element values at the fifth position may be input to the operator 30, and in the second cycle (cycle 2), the first and second non-zero element values at the sixth position may be input into the calculator 30. If there is no element to be operated in PE00, the PE controller 20 may notify this to the controller 122.

In conclusion, PE00 may perform an operation between the first and second elements that takes a total of two cycles.

Figure 8B:
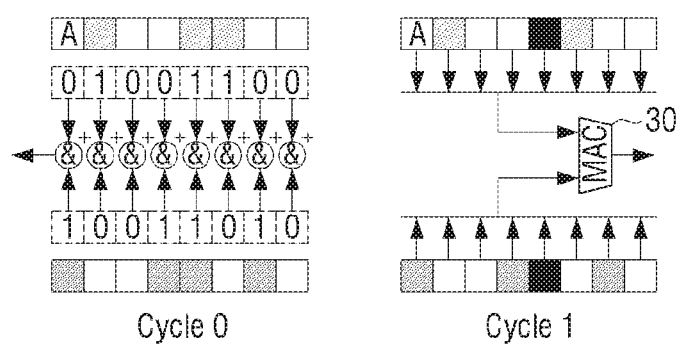

Also, as shown in FIG. 8B, LC2 may identify a position having a value of "1" on respective arrays of the first bitmap "10011010" and the second bitmap "01001100" input to the PE01 ("1" in the fifth). The PE controller 20 may identify the first and second non-zero elements at the fifth position in the first and second bitmaps, and input the identified first and second elements into the calculator 30 through a multiplexer.

In the first cycle of PE01, the first and second non-zero element values at the fifth position may be input into the calculator 30. If there is no element to be calculated in PE01, the PE controller 20 may notify this to the controller 122.

In other words, an operation between the first and second elements may be performed in PE01 over a total of one cycle.

Figure 8C:
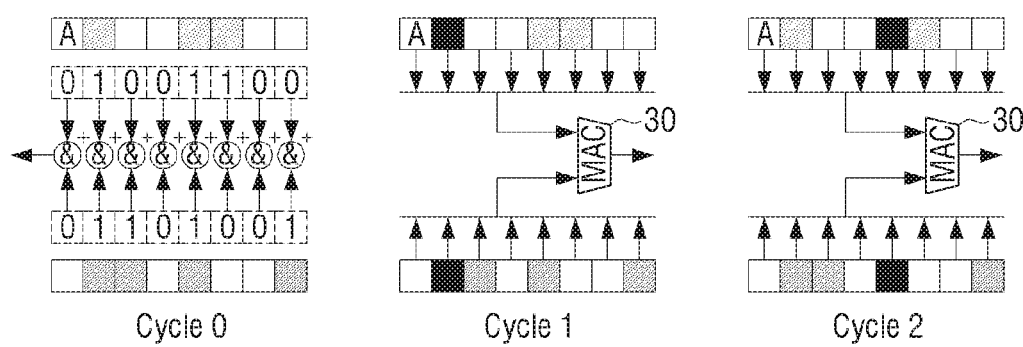

Also, as shown in FIG. 8C, LC3 may identify the positions having "1" on respective arrays of the first bitmap "01101001" and the second bitmap "01001100" input to the PE02 (i.e., "1" in the second position and "1" in the fifth position from the left). The PE controller 20 may identify the first and second non-zero elements in the second positions in the first and second bitmaps, and the first and second non-zero elements in the fifth positions in the first and second bitmaps, and input the identified first and second non-zero elements to the calculator 30 through a multiplexer.

In the first cycle of PE02, the first and second non-zero element values in the second position may be input to the calculator 30, and in the second cycle, the first and second element values in the fifth position may be input to the calculator 30. If there is no element to be operated in the PE02, the PE controller 20 may notify this to the controller 122.

In other words, an operation between the first element and the second element may be performed in PE02 over a total of two cycles.

Figure 8D:
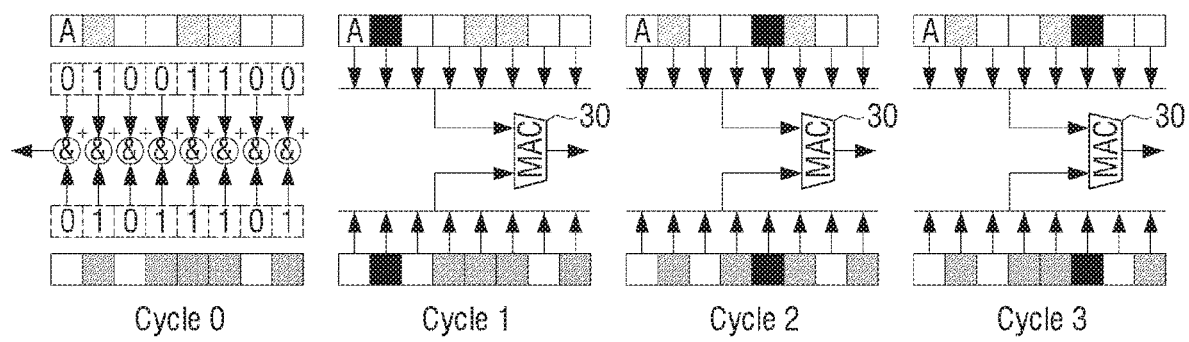

Also, as shown in FIG. 8D, LC4 may identify the positions having a value of "1" on the respective arrays of the first bitmap "01011101" and the second bitmap "01001100" input to the PE03 (i.e., "1" in the second position, "1" in the fifth position, and "1" in the sixth position from the left). The PE controller 20 may identify first and second non-zero elements at the second position in the first and second bitmaps, first and second non-zero elements at the fifth position in the first and second bitmaps, and first and second non-zero elements at the sixth position in the first and second bitmaps, and input only the identified first and second non-zero elements into the calculator 30 through the multiplexer.

In the first cycle of PE03, the first and second elements values in the second position may be input into the calculator 30; in the second cycle, the first and second element values in the fifth position may be input into the calculator 30; and in the third cycle, the first and second element values in the sixth position may be input into the calculator 30.

In other words, an operation may be performed between the first element and the second element in PE03 over a total of three cycles.

According to the embodiment of FIGS. 8A to 8D, cycles respectively corresponding to the depths of the first and second elements, that is, 8 cycles, are used for performing the operations in PE00 to PE03. However, only three cycles, which are the most frequently required cycles in PE00 to PE03, may be required.

Therefore, there is a problem in that the operation efficiency is reduced due to an unnecessary operation by the element having a non-zero value without considering sparsity of object data and kernel data. Embodiments of the disclosure may achieve higher operation efficiency by removing the sparsity of object data and kernel data using the AND gate.

Figure 9A:
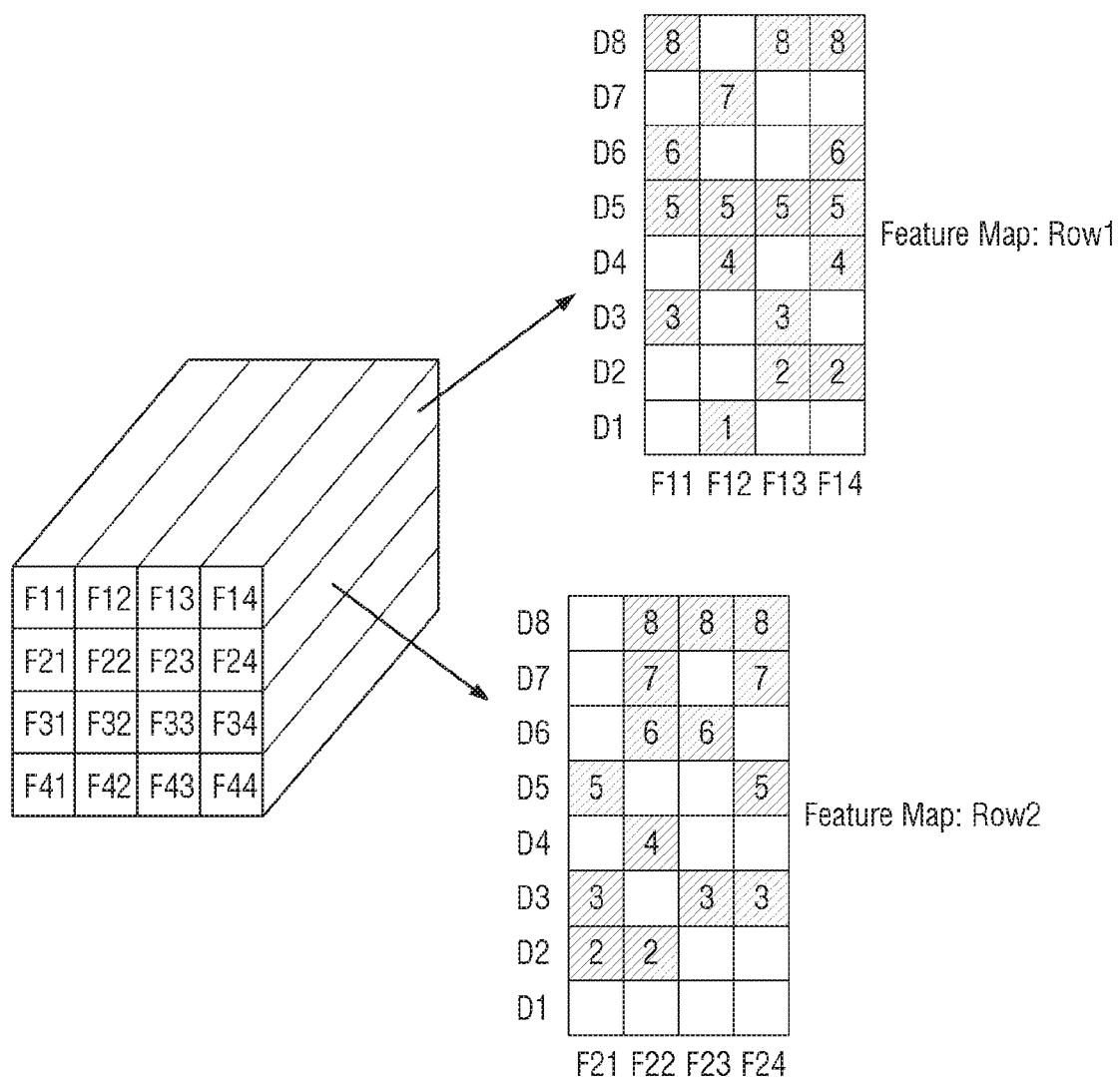
FIGS. 9A and 9B are views illustrating a non-zero element and a zero element of object data and kernel data according to an embodiment.
Figure 9B:
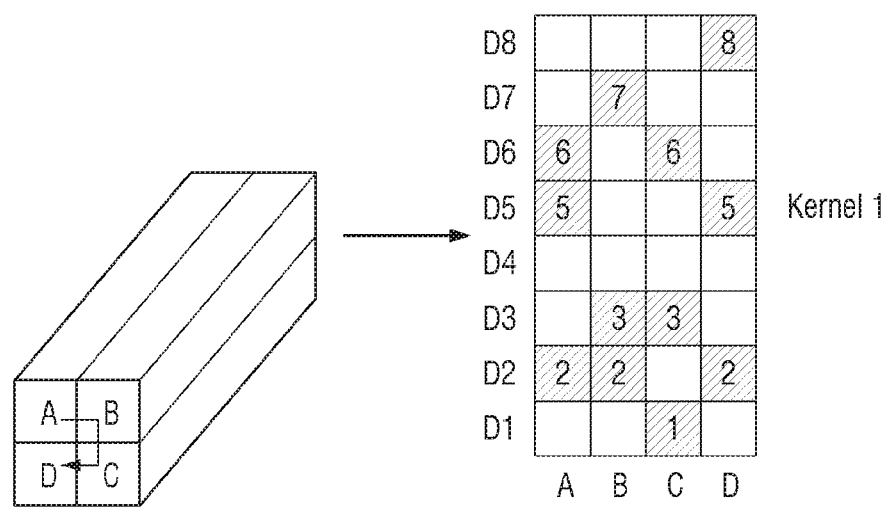

FIGS. 9A and 9B are views illustrating a non-zero element and a zero element of object data and kernel data according to an embodiment.

Hereinafter, FIG. 9A illustrates a first slice consisting of first elements in the first row of a 4×4 feature map, which is object data, and a second slice consisting of first elements in the second row of the 4×4 feature map to explain a method for operating in a plurality of processing elements in detail.

First elements F11 to F14 constituting the first slice each may have 8 (eight) depths D1 to D8, and first elements F21 to F24 constituting the second slice each may have 8 (eight) depths D1 to D8.

FIG. 9B shows the second elements of the 2×2 kernel data in the input order (A, B, C, and D) to a processing element. The second elements A to D each may have 8 (eight) depths D1 to D8, like the object data.

FIGS. 9A and 9B illustrate a zero-element having a zero value among elements respectively included in first and second slices as a blank space, and a non-zero element having a non-zero value as a number corresponding to its depth for ease of explanation.

Figure 10:
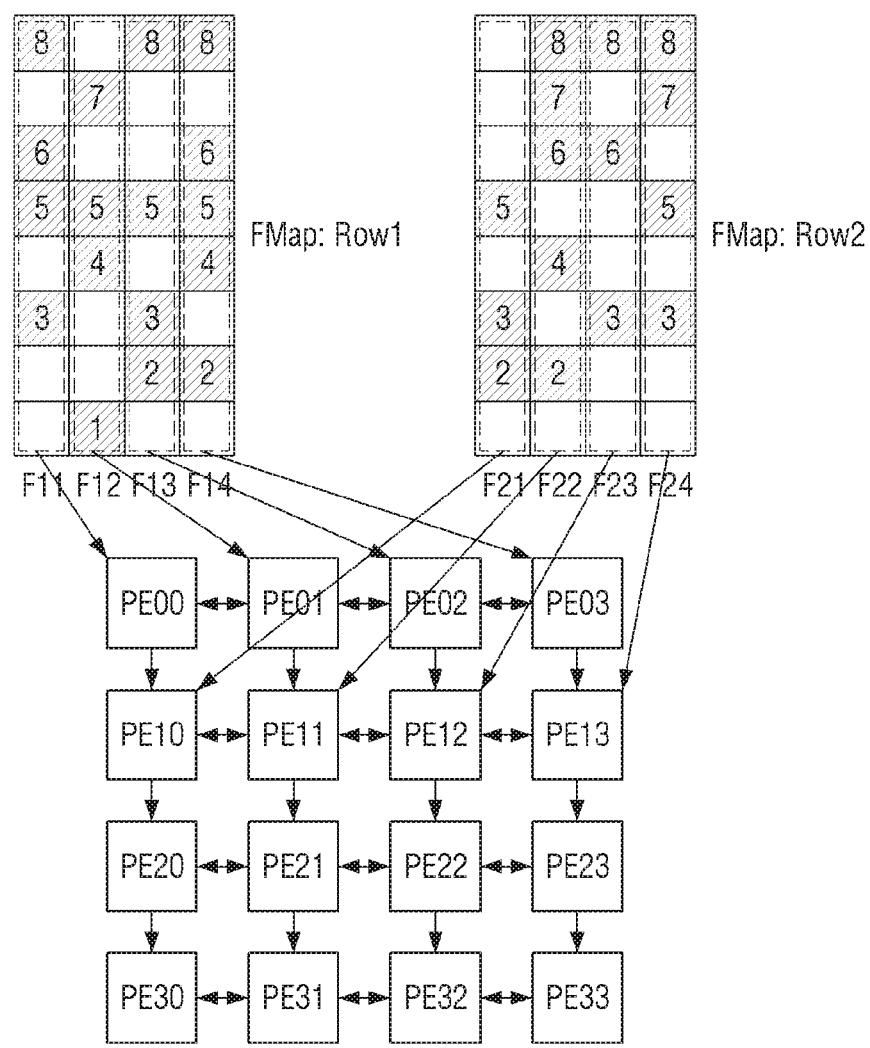
FIG. 10 is a view to explain a method for inputting object data into a plurality of processing elements according to an embodiment.

FIG. 10 is a view to explain a method for inputting object data into a plurality of processing elements according to an embodiment.

Referring to FIG. 10, the controller 122 may input the first elements corresponding to F11 to F14 of the first slice into the first buffers 10 of first processing elements in the first row among the plurality of processing elements, that is, PE00 to PE03, and input the first elements corresponding to F21 to F24 of the second slice into the first buffers 10 of the second processing elements in the second row among the plurality of processing elements, that is, PE10 to PE13. In other words, the arrangement of the first elements F11 to F44 constituting object data may be the same as the matrix arrangement of PE00 to PE33, and the first elements F11 to F44 may be input to the processing elements in the same row and column.

For example, data of all depths of the first element corresponding to F11 may be stored in the first buffer 10 of PE00, and bitmap "00101101" corresponding to F11 may be stored as described above.

Based on the above, FIGS. 11A through 11I explain a method for performing a convolution operation according to a CNN of a plurality of processing elements in detail according to an embodiment.

FIGS. 11A through 11I illustrates that A to D constituting the second elements are sequentially input into a plurality of processing elements 121-1 to 121-n. Hereinafter, for the sake of convenience, non-zero elements input to the calculator 30 through the AND gate, of A to D constituting the second elements, will be referred to as second element ①to second element ④, respectively.

Figure 11A:
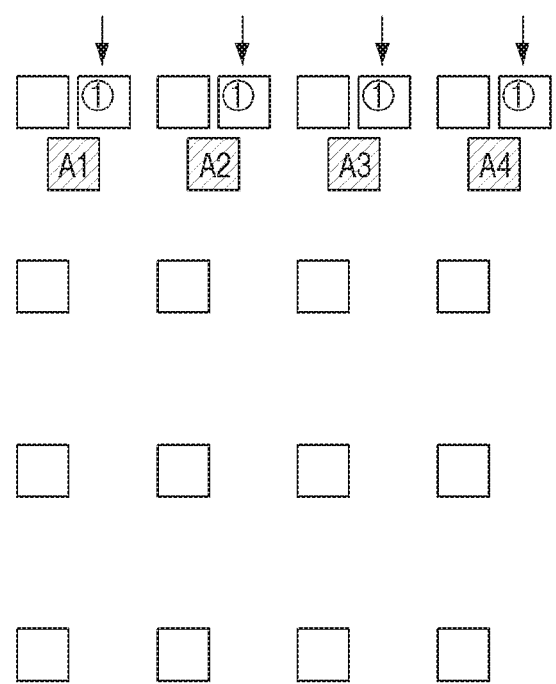
FIGS. 11A to 11I are views to explain a convolution operation method of a plurality of processing elements in detail according to an embodiment.

Referring to FIG. 11A, in the first clock (i.e., the first clock cycle), the second elements ①, which are non-zero elements of the second element A, may be respectively input into PE00 to PE03 in the first row of the plurality of processing elements 121-1 to 121-n.

The second elements A may be sequentially input to the plurality of processing elements 121-1 to 121-n in the column direction, and PE00 to PE03 may multiply a first non-zero element, in which a zero element is removed by the AND gate, among a plurality of first elements in the first row of object data by the second element ①. In other words, PE00 to PE03 may include the values obtained by multiplying the second elements ① by the non-zero elements corresponding to the respective PEs A1 to A4.

PE00 to PE03 may transmit the accumulation of the values A1 to A4 obtained by multiplying the second elements ① by the first non-zero elements corresponding to the respective PEs to the adjacent PE and perform a convolution operation. Such operation may be repeated for all the remaining second elements 2, 3, and 4 of the first kernel.

Figure 11B:
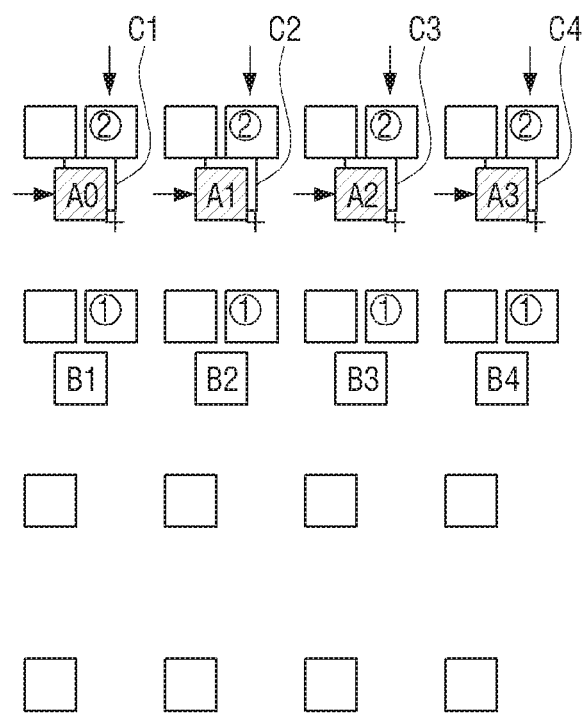

As shown in FIG. 11B, in the following clock (i.e., clock cycle), the second elements ② may be respectively input to PE00 to PE03, and the second elements ① may be respectively input to PE10 to PE13 in the second row.

The resultant values B1 to B4 may be obtained by multiplying the second elements ① by the first non-zero elements input to PE10 to PE13 in the second row, respectively. Further, the resultant values C1 to C4 may also be obtained by multiplying the second elements ② by the first non-zero elements of PE00 to PE03 in the first row.

A1 to A4 from the previous clock may also be shifted by one cell to the PE adjacent to the right side, and respectively added to C1 to C4 (i.e., adding A0 to C1, A1 to C2, A2 to C3, and A3 to C4) to perform an accumulation operation.

The direction in which the accumulation operation is performed may be the same as the direction corresponding to the order of movement from A to D in the first kernel (the direction of the arrow from A to D in FIG. 9B). As shown in FIG. 11B, C1 to C4 may be respectively added to A0 to A3 (i.e., adding A0 to C1, A1 to C2, A2 to C3, and A3 to C4). A0 may represent a resultant value transmitted from the PE located on the left side of the PE00.

Figure 11C:
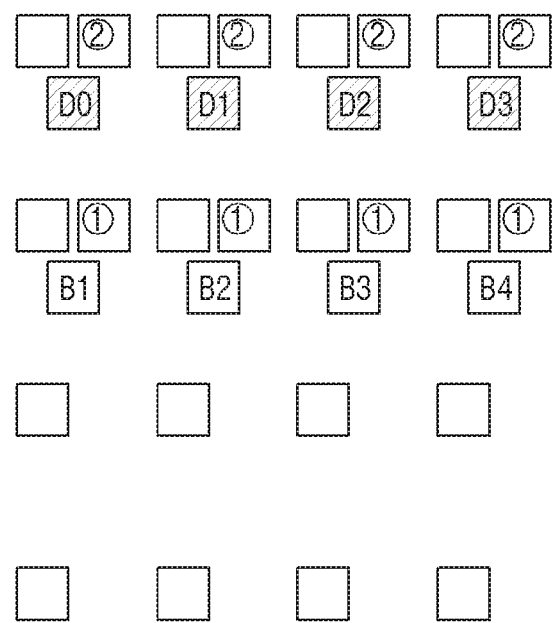

FIG. 11C shows first accumulation values D0 to D3 in which C1 to C4 are respectively added to A0 to A3.

Figure 11D:
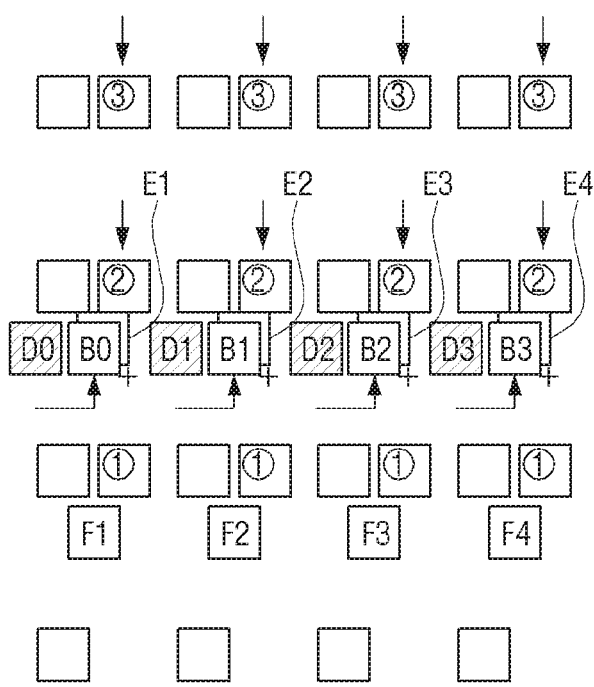

In the following clock (i.e., clock cycle), as shown in FIG. 11D, the second elements ③ may be respectively input to PE00 to PE03 in the first row, the second elements ① may be respectively input to PE20 to PE23 in the third row, and the second elements ② may be respectively input to PE10 to PE13 in the second row. The resultant values F1 to F4 may also be obtained by multiplying the second elements ① by the first non-zero elements of PE20 to PE23 in the third row, respectively. Further, the resultant values E1 to E4 may be obtained by multiplying the second elements ② by the first non-zero elements of PE10 to PE13 in the second row. The second elements ③ may also be multiplied by the first non-zero elements of PE00 to PE03 in the first row. For convenience of explanation, the resultant value may be omitted from the drawing.

Figure 11E:
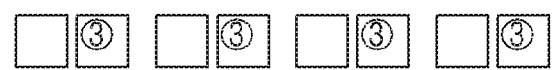
Figure 11E:
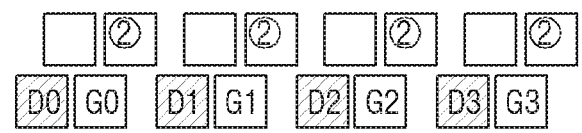
Figure 11E:
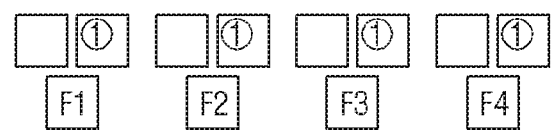
Figure 11E:

The first accumulation values D0 to D3 from the previous clock (i.e., clock cycle) may be shifted one by one to the PE adjacent to the bottom, and temporarily stored in the first kernel 10 of PE10 to PE13 in the second row. The values B0 to B3 from the previous clock may be shifted one by one to the PE adjacent to the right side, like the values A1 to A4 in the previous clock, and respectively added to E1 to E4 to perform an accumulation operation (i.e., adding E1 to B0, E2 to B1, E3 to B2, and E4 to B3). That is, the accumulation may be performed individually according to the direction of the order of movement from A to D in the first kernel (the direction of the arrow from A to D in FIG. 9B) in every PE in each row. FIG. 11E shows the accumulation values G0 to G3 obtained by adding E1 to E4 to B0 to B3, respectively (i.e., adding E1 to B0, E2 to B1, E3 to B2, and E4 to B3).

Figure 11F:
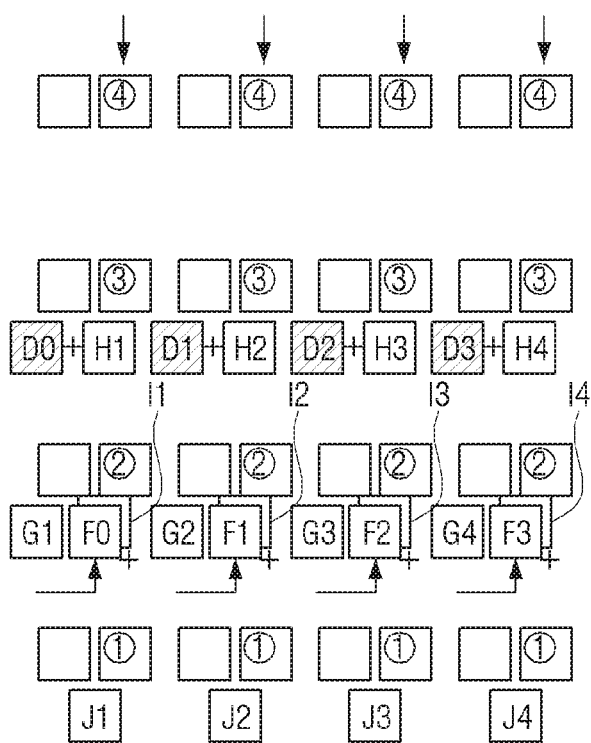

In the following clock, as shown in FIG. 11F, the second elements ④, which are the last elements of the kernel data, may be respectively input to PE00 to PE03 in the first row, and the second elements ① may be input to PE31 to PE33 in the fourth row, the second elements ② may be input to PE21 to PE23 in the third row, and the second elements ③ may be input to PE11 to the PE13 in the second row, respectively. The resultant values J1 to J4 may be obtained by multiplying the second elements ① by the first non-zero elements of PE31 to PE33 in the fourth row, respectively. The resultant values I1 to I4 may also be obtained by multiplying the second elements ② by the first elements of PE21 to PE23 in the third row, and the resultant values H1 to H4 may be obtained by multiplying the second elements ③ by first non-zero elements input to PE11 to PE13 in the second row. The second elements ④ may also be multiplied by the first non-zero elements of PE00 to PE03 in the first row. For convenience of explanation, the resultant value is omitted from the drawing.

Figure 11G:
Figure 11G:
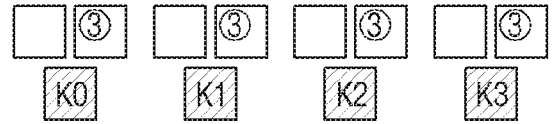
Figure 11G:
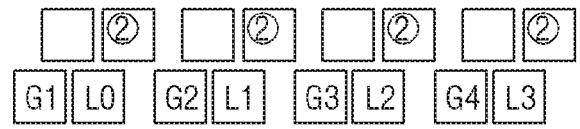
Figure 11G:
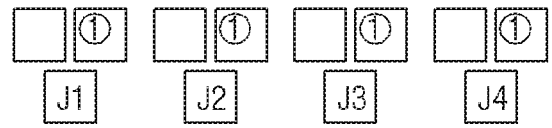

Meanwhile, the accumulation values D0 to D3 from the previous clock may be added to H1 to H4, respectively (i.e., adding D0 to H1, D1 to H2, D2 to H3, and D3 to H4), so that the second accumulation values K0 to K3 may be obtained as shown in FIG. 11G. L0 to L3 in the third row may be the values obtained by adding F0 to F3 moved one by one to the PE adjacent to the right side to I1 to I4, respectively (i.e., adding I1 to F0, I2 to F1, I3 to F2, and I4 to F3).

Figure 11H:
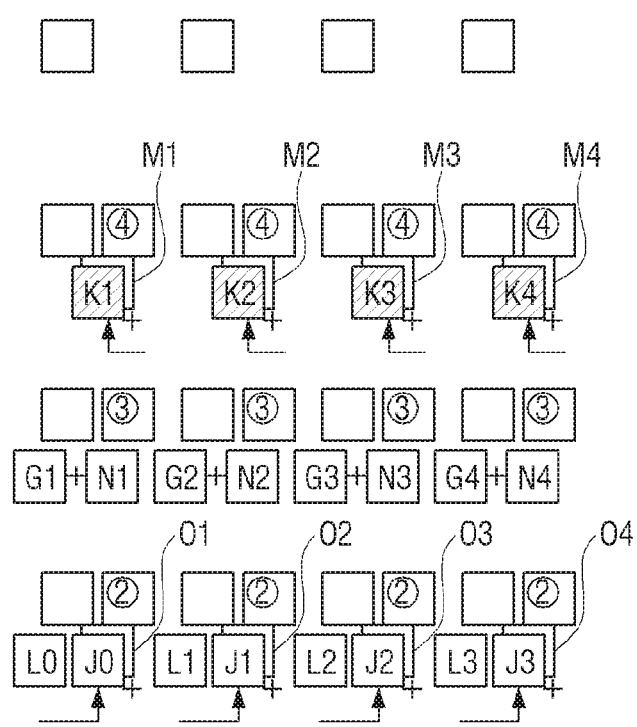

In the following clock, as shown in FIG. 11H, the second elements ② may be respectively input to PE31 to PE33 in the fourth row, the second elements ③ may be respectively input to PE21 to PE23 in the third row, and the second elements ④ may be input to PE11 to PE13 in the second row. The resultant values M1 to M4 may be obtained by multiplying the second elements ④ by the first non-zero elements of PE11 to PE13 in the second row, respectively. The second accumulation values K1 to K4 from the previous clock may be shifted one by one to the PE adjacent to the left side, and respectively added to M1 to M4 to perform an accumulation operation (i.e., adding M1 to K1, M2 to K2, M3 to K3, and M4 to K4). Hereinafter, as shown in FIG. 11H, the second elements ② and the second elements ③ may perform separate accumulation operations in the fourth row and the third row, respectively.

Figure 11I:
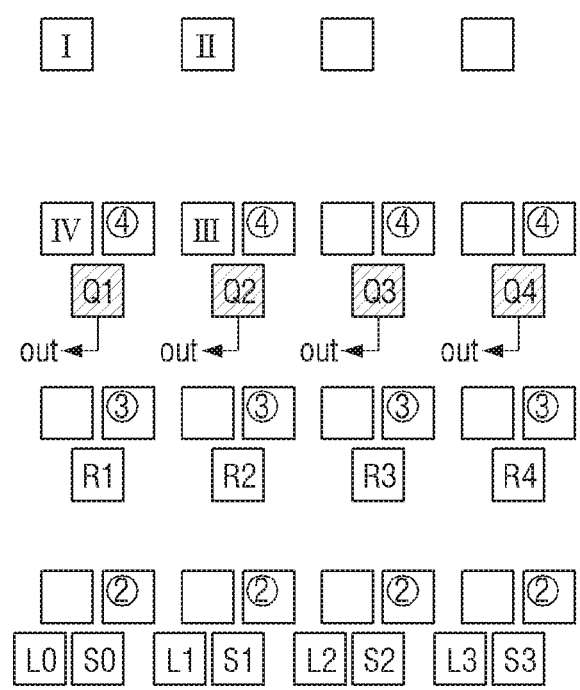

FIG. 11I shows third accumulation values Q1 to Q4 in which second accumulation values K1 to K4 are added to M1 to M4. The third accumulation values Q1 to Q4 may be equal to the sum of the values obtained by multiplying the second element ① to the second element ④ of the kernel data by first elements I to IV of the object data, respectively, and the third accumulation values Q1 to Q4 may be output through an output terminal to be an element in the first row and the first column of new object data (feature map) derived by the above-described convolution operation.

FIGS. 12A to 12H are views to explain a cycle-basis operation of a plurality of processing elements according to an embodiment.

Figure 12A:
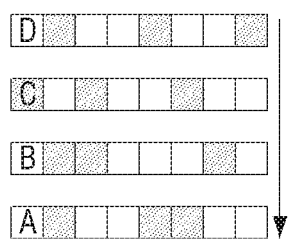
FIGS. 12A to 12H are views to explain cycle-based operations of a plurality of processing elements according to an embodiment.
Figure 12A:
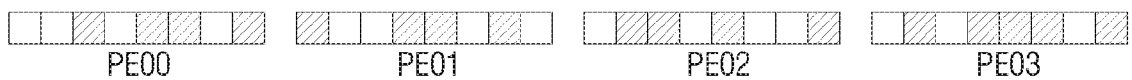
Figure 12A:
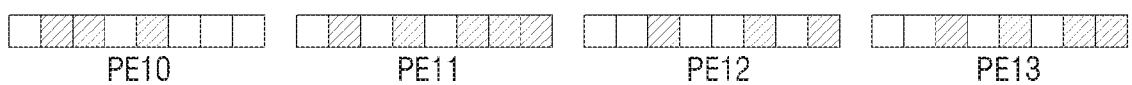
Figure 12A:
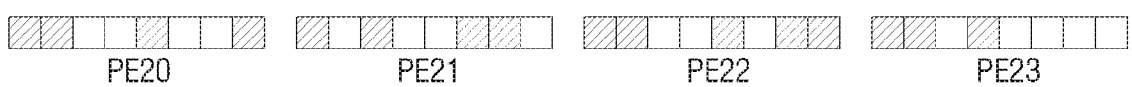
Figure 12A:
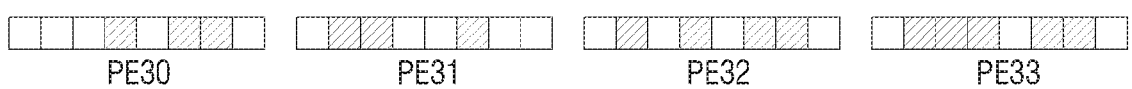

FIG. 12A shows that the first element of object data is stored in each of the plurality of processing elements, and the second elements A to D constituting the kernel data are sequentially input to the plurality of processing elements (step S0).

FIG. 12B to FIG. 12H illustrate step 1 S1 to step 7 S7 to show the process of performing operations of a plurality of processing elements as second elements A to D of kernel data are input in order. The process in which second elements A to D sequentially input into respective rows of the plurality of processing elements is shown in each step.

Figure 12B:
Figure 12B:
Figure 12B:
Figure 12B:
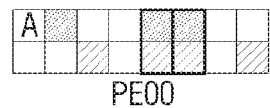
Figure 12B:
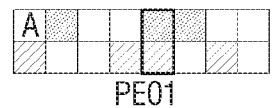
Figure 12B:
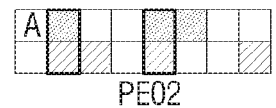
Figure 12B:
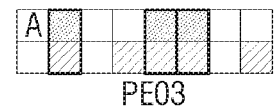
Figure 12B:
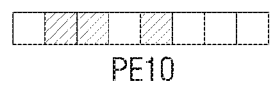
Figure 12B:
Figure 12B:
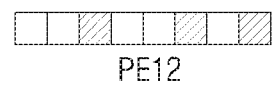
Figure 12B:
Figure 12B:
Figure 12B:
Figure 12B:
Figure 12B:
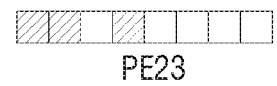
Figure 12B:
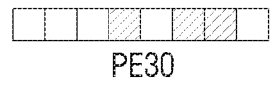
Figure 12B:
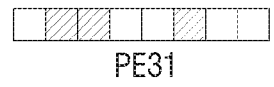
Figure 12B:
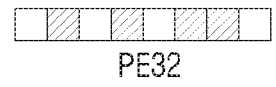
Figure 12B:
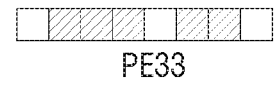

FIG. 12B shows that an operation is performed by inputting, into the calculator 30, first and second non-zero elements having a non-zero value in the same depth among the first elements respectively input to the first buffers 10 of PE00 to PE03 in the first row and the second elements A stored in the second buffers 40 corresponding to the first row.

Referring to FIG. 12B, an operation between the second element A and the fifth element (or fifth sub-element, position or depth) of the first element (element having the depth of 5) may be performed in the first cycle (e.g., first clock cycle) of PE00, and an operation between the second element A and the sixth element (or sixth sub-element, position or depth) of the first element (element having the depth of 6) may be performed in the second cycle (e.g., second clock cycle).

In PE01, an operation between the second element A and the fifth element of the first element may be performed in the first cycle.

In PE02, an operation between the second element A and the second element of the first element may be performed in the first cycle, and an operation between the second element A and the fifth element of the first element may be performed in the second cycle.

In PE03, an operation between the second element A and the second element of the first element may be performed in the first cycle, an operation between the second element A and the fifth element of the first element may be performed an the second cycle, and an operation between the second element A and the sixth element of the first element may be performed in the third cycle.

Therefore, the total number of cycles required (i.e., used) in step 1 may be 3 in PE03, which is the largest one of the numbers of cycles for performing the operations between the second elements A and the first elements in PE00 to PE03 of the first row.

Figure 12C:
Figure 12C:
Figure 12C:
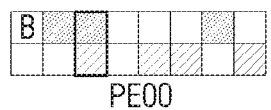
Figure 12C:
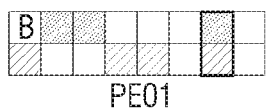
Figure 12C:
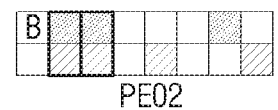
Figure 12C:
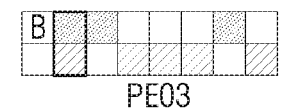
Figure 12C:
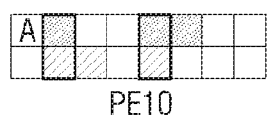
Figure 12C:
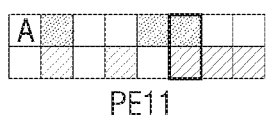
Figure 12C:
Figure 12C:
Figure 12C:
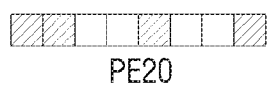
Figure 12C:
Figure 12C:
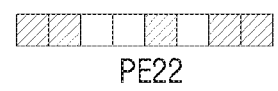
Figure 12C:
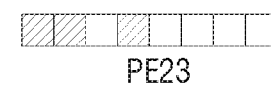
Figure 12C:
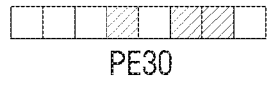
Figure 12C:
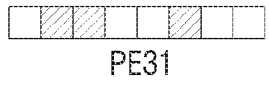
Figure 12C:
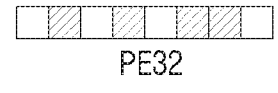
Figure 12C:
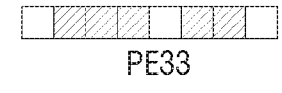

Referring to FIG. 12C, an operation may be performed by inputting first and second non-zero elements having a non-zero value in the same depth into the calculator 30 in the first elements stored in the first buffers 10 of PE10 to PE13 in the second row, and the second elements A stored in the second buffer 40 in the second row.

In addition, an operation may be performed by inputting first and second non-zero elements having a non-zero value in the same depth into the calculator 30 in the first elements respectively stored in the first buffers 10 of PE00 to PE03 and the second elements B in the input order to PE00 to PE03.

Referring to FIG. 12C, one cycle may be required in PE00, one cycle may be required in PE01, two cycles may be required in PE02, and one cycle may be required in PE03.

Therefore, the total number of cycles required may be 2 in PE02, which is the largest one of the numbers of cycles for performing the operations between the second elements A and the first elements in PE00 to PE03 of the first row.

In addition, the total number of cycles required may be 2 in PE10, which is the largest one of the numbers of cycles required for performing the operations between the second elements A and the first elements in PE10 to PE13 of the second row.

As a result, the number of cycles required in step 2 may be 2, which is commonly required in the first row and the second row.

Figure 12D:
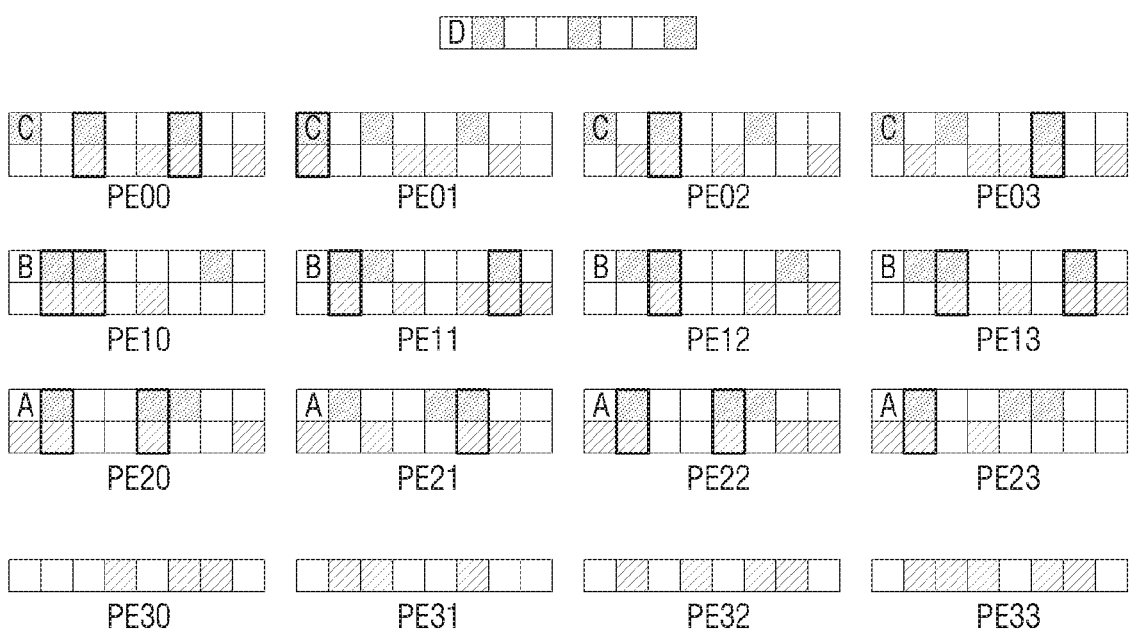

Referring to FIG. 12D, an operation may be performed by inputting first and second non-zero elements having a non-zero value in the same depth into the calculator 30 in the first elements respectively stored in the first buffers 10 of PE20 to PE23 in the third row and the second elements A stored in the second buffers 40 in the third row.

In addition, an operation may be performed by inputting first and second non-zero elements having a non-zero value in the same depth into the calculator 30 in the first elements respectively stored in the first buffers 10 of PE10 to PE13 in the second row and the second elements B stored in the second buffers 40 in the second row.

Further, an operation may be performed by inputting first and second non-zero elements having a non-zero value in the same depth into the calculator 30 in the first elements respectively stored in the first buffers 10 of PE00 to PE03 in the first row and the second elements C stored in the first buffers 10 of PE00 to PE03 in the first row.

As shown in FIG. 12D, two cycles may be required in PE00, one cycle may be required in PE01, one cycle may be required in PE02, and one cycle may be required in PE03.

Therefore, the total number of cycles required may be 2 in PE00, which is the largest one of the numbers of cycles for performing the operations between the second elements C and the first elements in PE00 to PE03 in the first row.

In addition, the total number of cycles required may be 2 in PE10, PE11 and PE13, which is the largest one of the numbers of cycles for performing the operations between the second elements B and the first elements in PE10 to PE13 in the second row.

The total number of cycles required may be 2 in PE20 and PE22, which is the largest one of the numbers of cycles for performing the operations between the second elements A and the first elements in PE20 to PE23 in the third row.

The total number of cycles required in step 3 may be 2, which is commonly required in the first row, the second row and the third row.

Figure 12E:
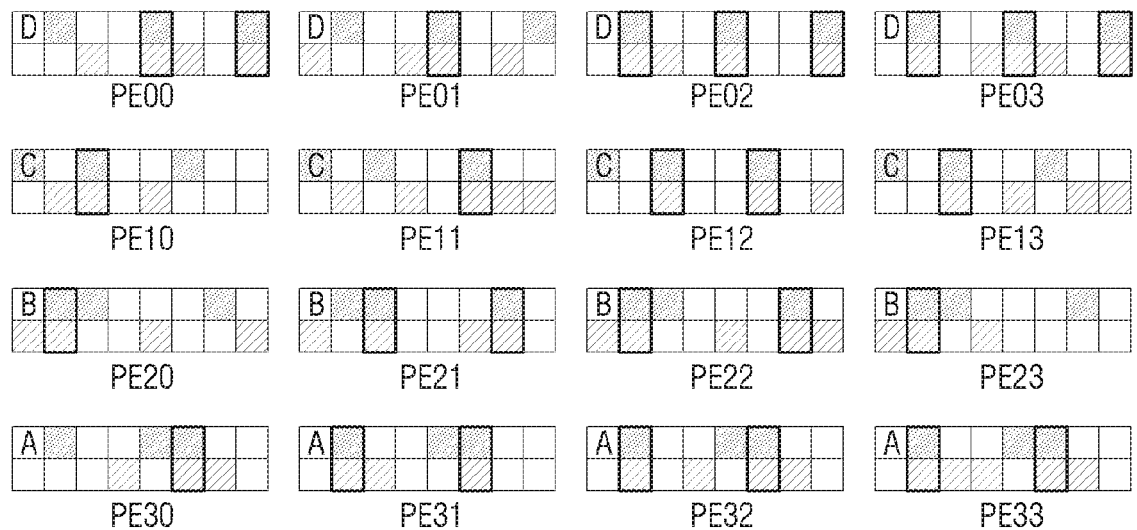

Thereafter, as shown in FIG. 12E, an operation may be performed by inputting first and second non-zero elements having a non-zero value in the same depth into the calculator 30 in the first elements respectively stored in the first buffers 10 of PE30 to PE33, and the second elements A stored in the second buffers 40 in the fourth row.

An operation may be performed by inputting first and second non-zero elements having a non-zero value in the same depth into the calculator 30 in the first elements respectively stored in the first buffers 40 of PE20 to PE23, and the second elements B stored in the second buffers 40 in the third row.

An operation may be performed by inputting first and second non-zero elements having a non-zero value in the same depth into the calculator 30 in the first elements respectively stored in the first buffers 10 of PE10 to PE13, and the second elements C stored in the second buffers 40 in the second row.

An operation may be performed by inputting first and second non-zero elements having a non-zero value in the same depth into the calculator 30 in the first elements respectively stored in the first buffers 10 of PE00 to PE03, and the second elements D stored in the second buffers 40 in the first row.

As shown in FIG. 11E, two cycles may be required in PE00, one cycle may be required in PE01, three cycles may be required in PE02, and three cycles may be required in PE03.

The total number of cycles required may be 3 in PE02 and PE03, which is the largest one of the numbers of cycles for performing the operations between the non-zero elements of the second elements D and the non-zero elements of the first elements in PE00 to PE03 in the first row.

The total number of cycles required may be 2 in PE12, which is the largest one of the numbers of cycles for performing the operations between the non-zero elements of the second elements C and the non-zero elements of the first elements in PE10 to PE13 in the second row.

The total number of cycles required may be 2 in PE21 and PE22, which is the largest one of the numbers of cycles for performing the operations between the non-zero elements of the second elements B and the non-zero elements of the first elements in PE20 to PE23 in the third row.

The total number of cycles required may be 2 in PE31, PE32 and PE33, which is the largest one of the numbers of cycles for performing the operations between the non-zero elements of the second elements A and the non-zero elements of the first elements in PE30 to PE33 in the fourth row.

The total number of cycles required in step 4 may be 3 in the first row, which is the largest one of the numbers of cycles for performing the operations in each row.

Figure 12F:
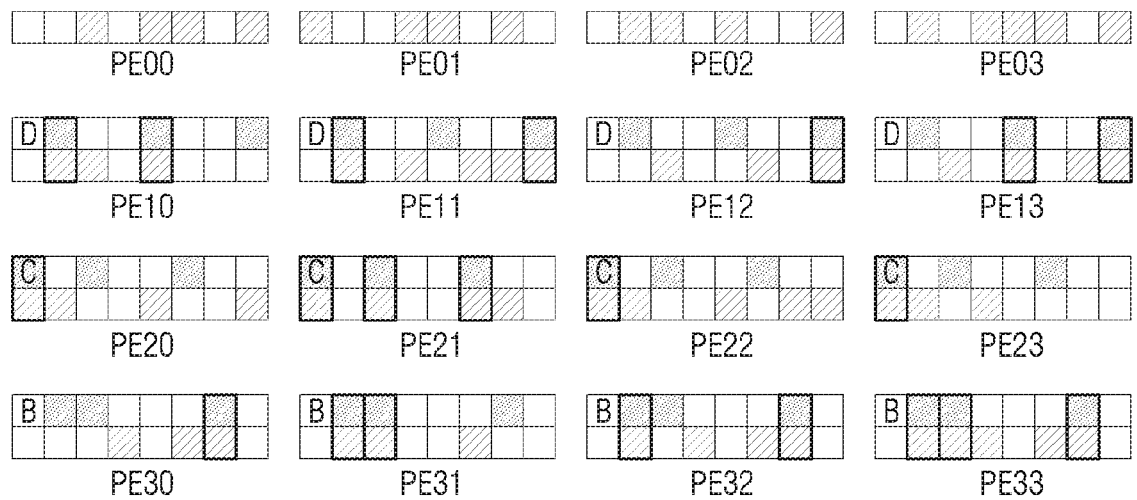

As shown in FIG. 12F, an operation may be performed by inputting first and second non-zero elements having a non-zero value in the same depth into the calculator 30 in the first elements respectively stored in the first buffers 10 of PE30 to PE33, and the second elements B stored in the second buffers 40 in the fourth row.

An operation may be performed by inputting first and second non-zero elements having a non-zero value in the same depth into the calculator 30 in the first elements respectively stored in the first buffers 10 of PE20 to PE23, and the second elements C stored in the second buffers 40 in the third row.

An operation may be performed by inputting first and second non-zero elements having a non-zero value in the same depth into the calculator 30 in the first elements respectively stored in the first buffers 10 of PE10 to PE13, and the second elements D stored in the second buffers 40 in the second row.

An operation may be performed by inputting first and second non-zero elements having a non-zero value in the same depth into the calculator 30 in the first elements respectively stored in the first buffers 10 of PE00 to PE03, and the second elements E stored in the second buffers 40 in the first row. However, the operations of the second elements E of the second kernel and the subsequent operations are omitted in the drawings, and will not be shown in the following description.

As shown in FIG. 12F, two cycles may be required in PE10, two cycles may be required in PE11, one cycle may be required in PE12, and two cycles may be required in PE13.

The total number of cycles required may be 2 in PE10, PE11 and PE13, which is the largest one of the numbers of cycles for performing the operations between the second elements D and the first elements in PE10 to PE13 in the second row.

The total number of cycles required may be 3 in PE21, which is the largest one of the numbers of cycles for performing the operations between the second elements C and the first elements in PE20 to PE23 of the third row.

The total number of cycles required may be 3 in PE33, which is the largest one of the numbers of cycles for performing the operations between the second elements B and the first elements in PE30 to PE33 of the fourth row.

The total number of cycles required in step 5 may be 3 in the third and fourth rows, which is the largest one of the numbers of cycles for performing the operations in each row.

Figure 12G:
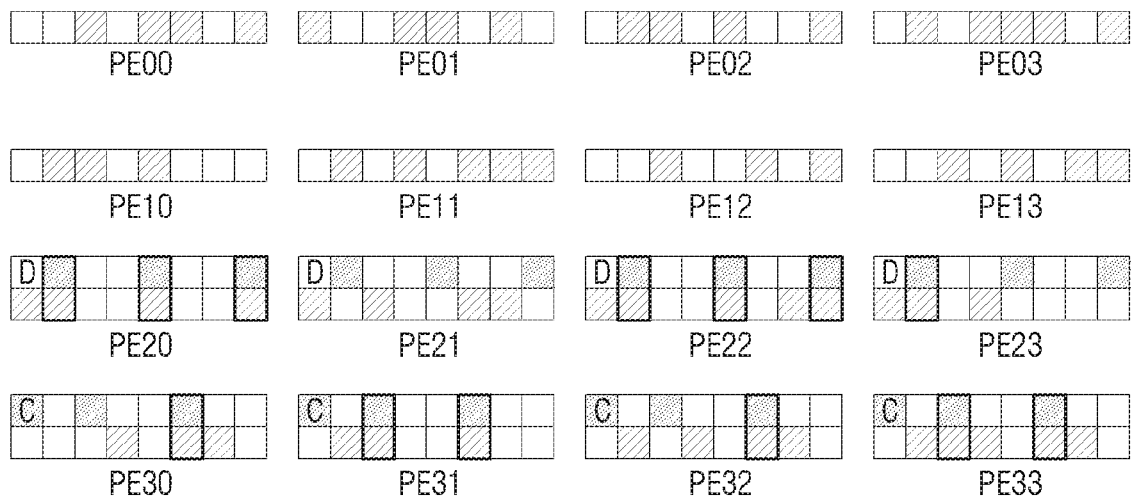

As shown in FIG. 12G, an operation may be performed by inputting first and second non-zero elements having a non-zero value in the same depth into the calculator 30 in the first elements respectively stored in the first buffers 10 of PE30 to PE33, and the second elements C stored in the second buffers 40 in the fourth row.

An operation may be performed by inputting first and second non-zero elements having a non-zero value in the same depth into the calculator 30 in the first elements respectively stored in the first buffers 10 of PE20 to PE23, and the second elements D stored in the second buffers 40 in the third row.

As shown in FIG. 12G, three cycles may be required in PE20, zero cycle may be required in PE21, three cycles may be required in PE22, and one cycle may be required in PE23.

The total number of cycles required may be 3 in PE20 and PE22, which is the largest one of the numbers of cycles for performing the operations between the second elements D and the first elements in PE20 to PE23 of the third row.

The total number of cycles required may be 3 in PE31 and PE33, which is the largest one of the numbers of cycles for performing the operations between the second elements C and the first elements in PE30 to PE33 of the fourth row.

The total number of cycles required in step 6 may be 3 in the third row, which is the largest one of the numbers of cycles for performing the operations in each row.

Figure 12H:
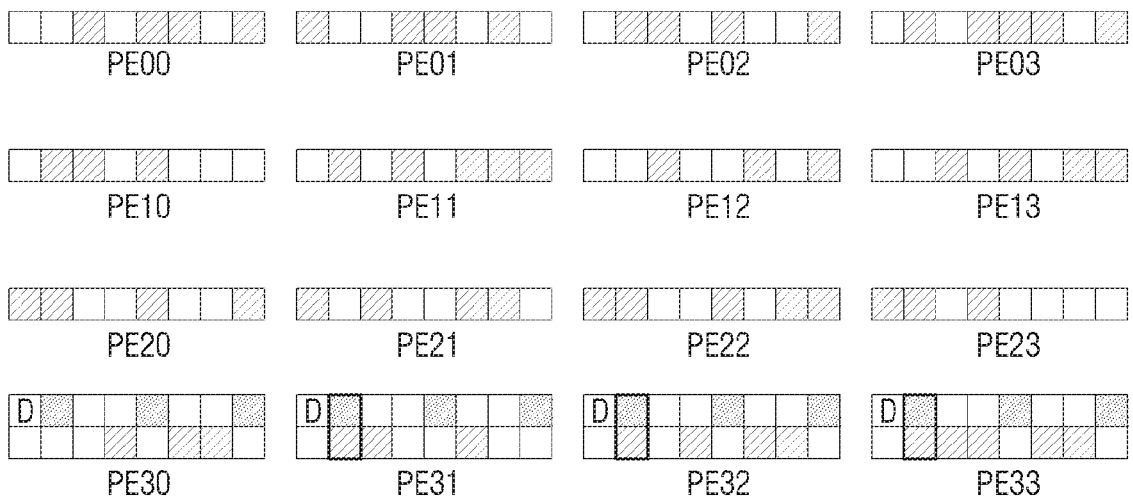

Referring to FIG. 12H, an operation may be performed by inputting first and second non-zero elements having a non-zero value in the same depth into the calculator 30 in the first elements respectively stored in the first buffers 10 of PE30 to PE33, and the second elements D stored in the second buffers 40 in the fourth row.

As shown in FIG. 12H, zero cycle may be required in PE30, one cycle may be required in PE31, one cycle may be required in PE32, and one cycle may be required in PE33.

The total number of cycles required may be 1 in PE31, PE32 and PE33, which is the largest one of the numbers of cycles for performing the operations between the second elements D and the first elements in PE30 to PE33 of the fourth row.

The total number of cycles required in step 7 may be 1 in the fourth row, which is the largest one of the numbers of cycles for performing the operations in each row.

Thus, the total number of cycles required in steps 1 to 7 may be 17 cycles. That is, as compared to a total of 56 cycles (8 cycles×7 steps) that are required when the sparsity of the kernel data and the object data is not removed, and a total of 21 cycles (3 cycles×7 steps) that are required when only the sparsity of the kernel data is removed, the number of cycles required for performing the same operation may be reduced according to an embodiment as described above.

The Second Example Embodiment

Figure 13:
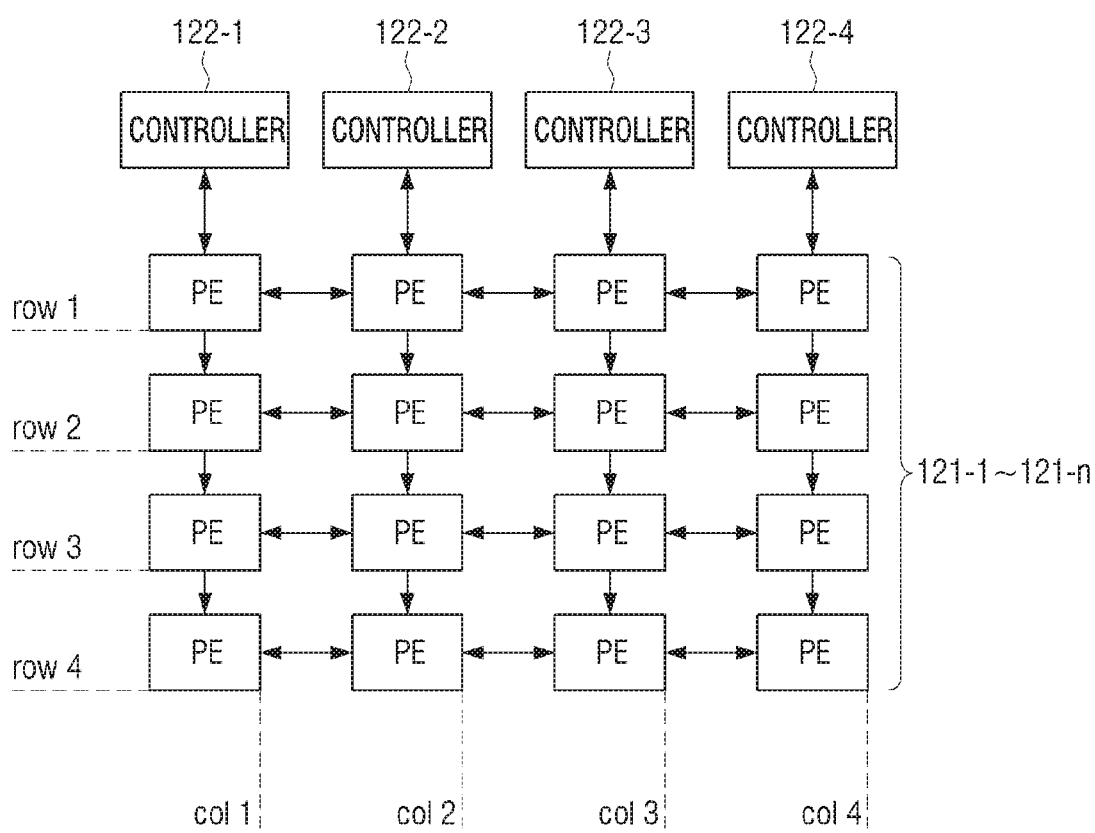
FIG. 13 is a block diagram illustrating configuration of a processor according to another embodiment.

FIG. 13 is a block diagram illustrating configuration of a processor 120 according to another embodiment.

Referring to FIG. 13, the processor 120 according to the present embodiment may include a plurality of controllers 122-1 to 122-n for controlling a plurality of processing elements 121-1 to 121-n individually respectively for each column, and the plurality of processing elements 121-1 to 121-n may each include a second buffer 40 for storing the second elements of kernel data. In other words, according to the present embodiment described below, the plurality of processing elements 121-1 to 121-n may have the structure shown in FIG. 6B.

When the operations on the second elements of the processing elements included in any one column among the plurality of processing elements 121-1 to 121-n are completed, each of the plurality of controllers 122-1 to 122-n may individually store the second elements in the following order in the second buffer 40 of the processing elements included in the column, and control the processing elements of the corresponding column so that the operation on each the plurality of processing elements 121-1 to 121-n may be independently performed for each column.

Hereinafter, an operation method for each processing element by column by a plurality of controllers will be described with reference to FIGS. 14 and 15A to FIG. 15O.

Figure 14:
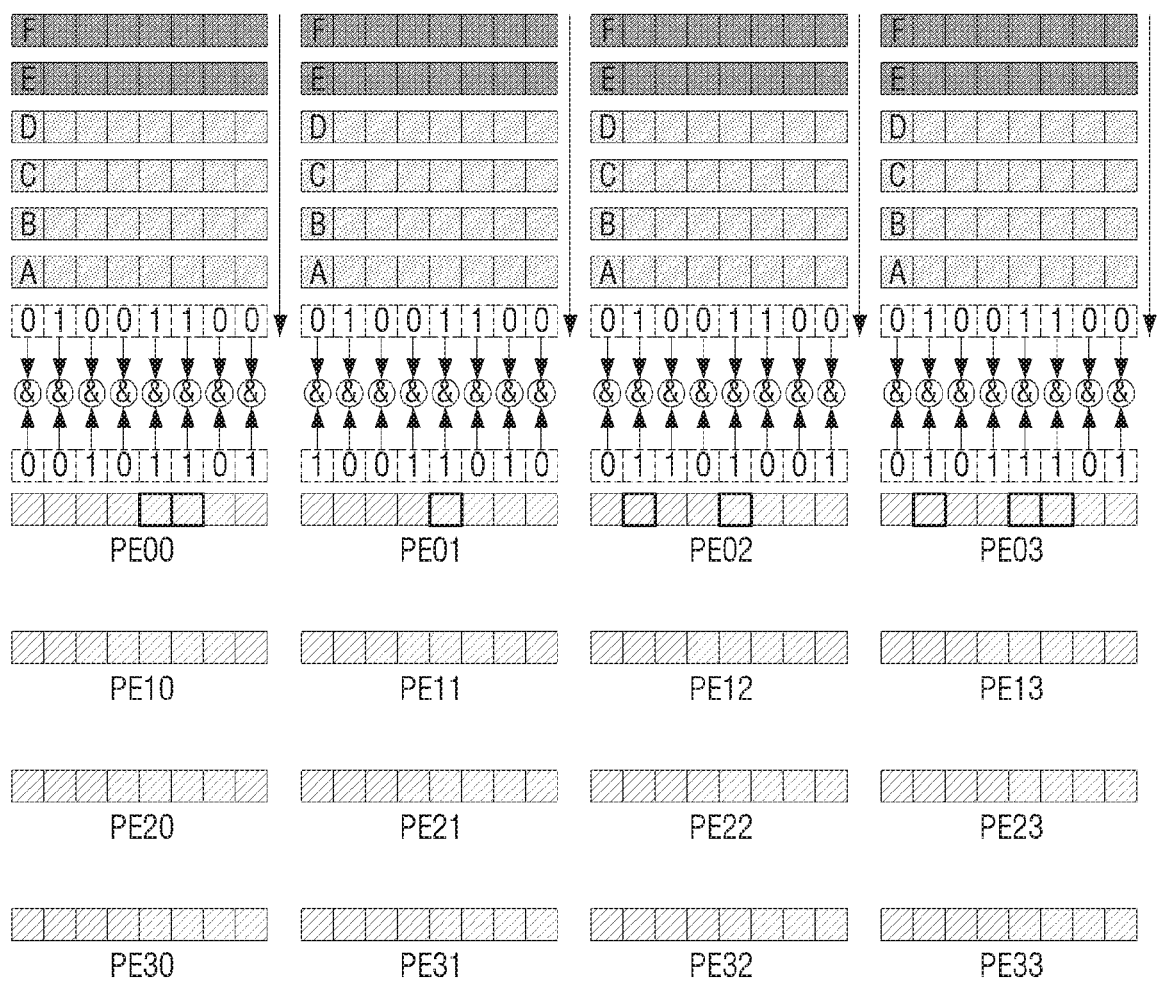
FIG. 14 is a view to explain a method for inputting kernel data of a plurality of processing elements according to another embodiment.

FIG. 14 is a view to explain a method for inputting kernel data for a plurality of processing elements according to another embodiment.

As shown in FIG. 14, each of the first to fourth controllers 122-1 to 122-4 may store a second element A constituting a first kernel and a bitmap of the second element A in a second buffer 40 included in each of the first processing elements in the first row, and input a first bitmap of the first element stored in the first buffer 10 of the first processing elements PE00, PE01, PE03 and PE04 and a second bitmap "01001100" of the second element A stored in each of the second buffers 40 into the PE controller 20 included in each of the first processing elements PE00, PE01, PE03 and PE04. The PE controller 20 may include a logic circuit, and the logic circuit may be embodied as the AND gate as in the above-described embodiment.

The first and second bitmaps may be input to AND gates included in the PE controller 20, and a plurality of AND gates included in the first processing elements PE00, PE01, PE03 and PE04 may respectively output the results of comparing the bitmap of the second element A "01001100" with the bitmaps of the first elements "00101101," "10011010," "01101001" and "01011101" and transmit each result of comparison to the calculator 30 included in each of the first processing elements PE00, PE01, PE03 and PE04.

Based on the structure of the processor 120, the cycle-based operations of a plurality of processing elements are described in detail below.

Figure 15A:
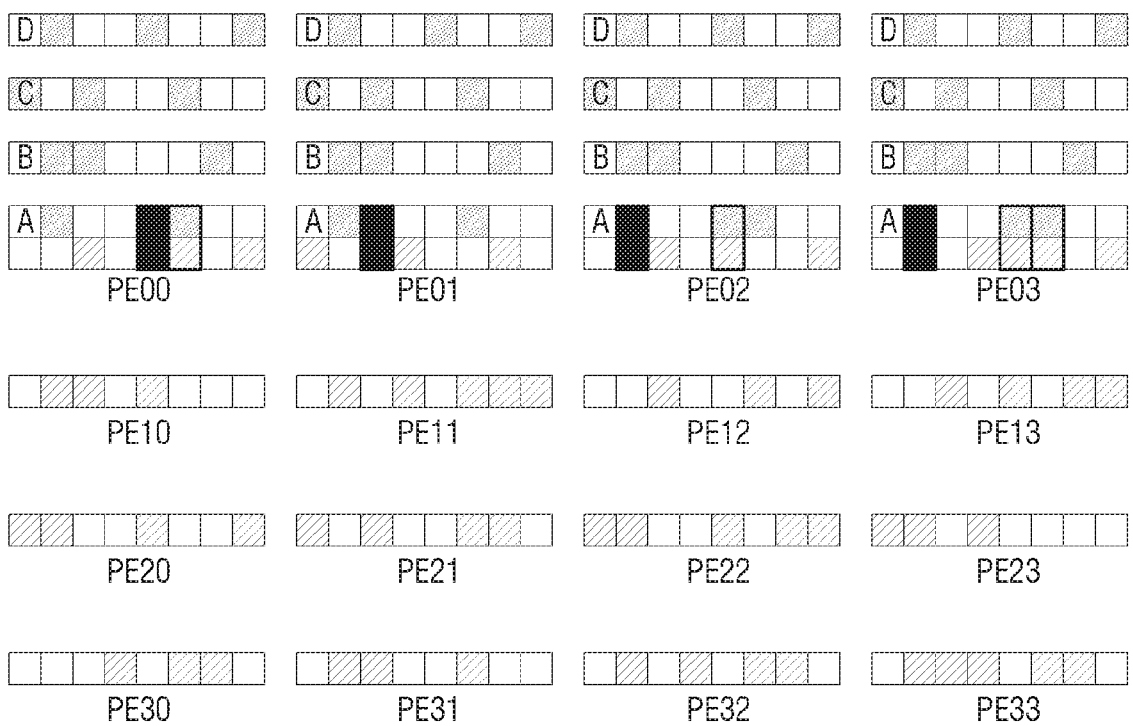
FIGS. 15A to 15O are views to explain cycle-based operations of a plurality of processing elements according to another embodiment.
Figure 15B:
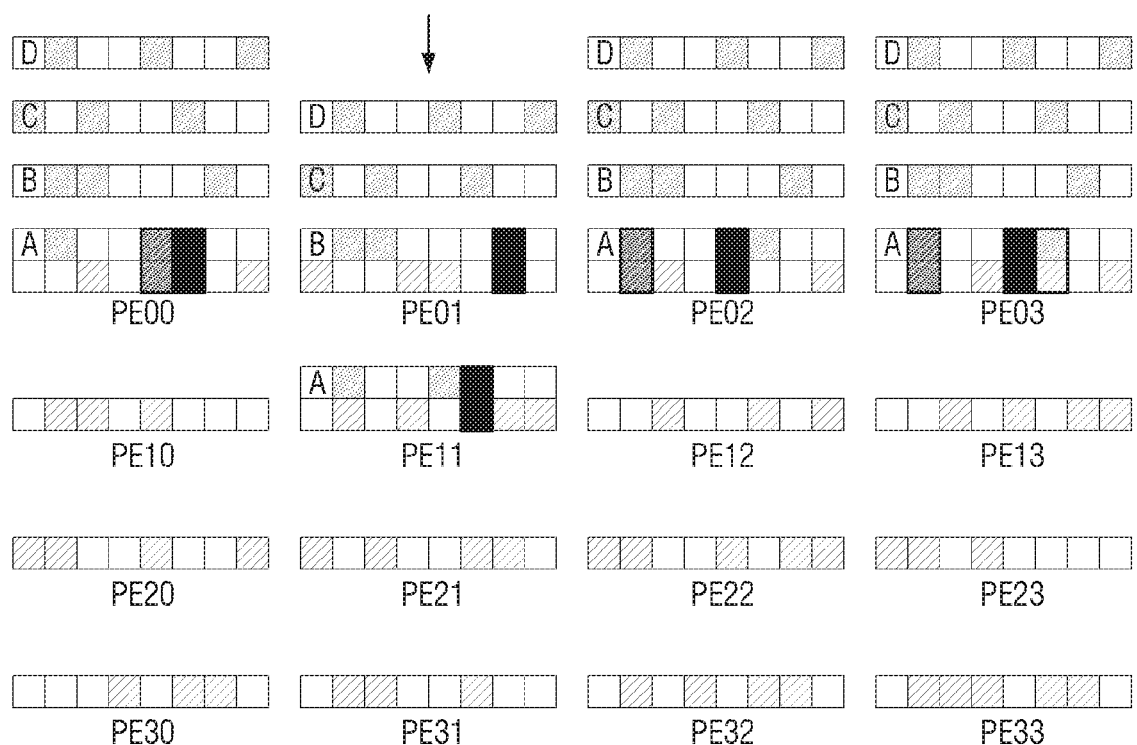
Figure 15C:
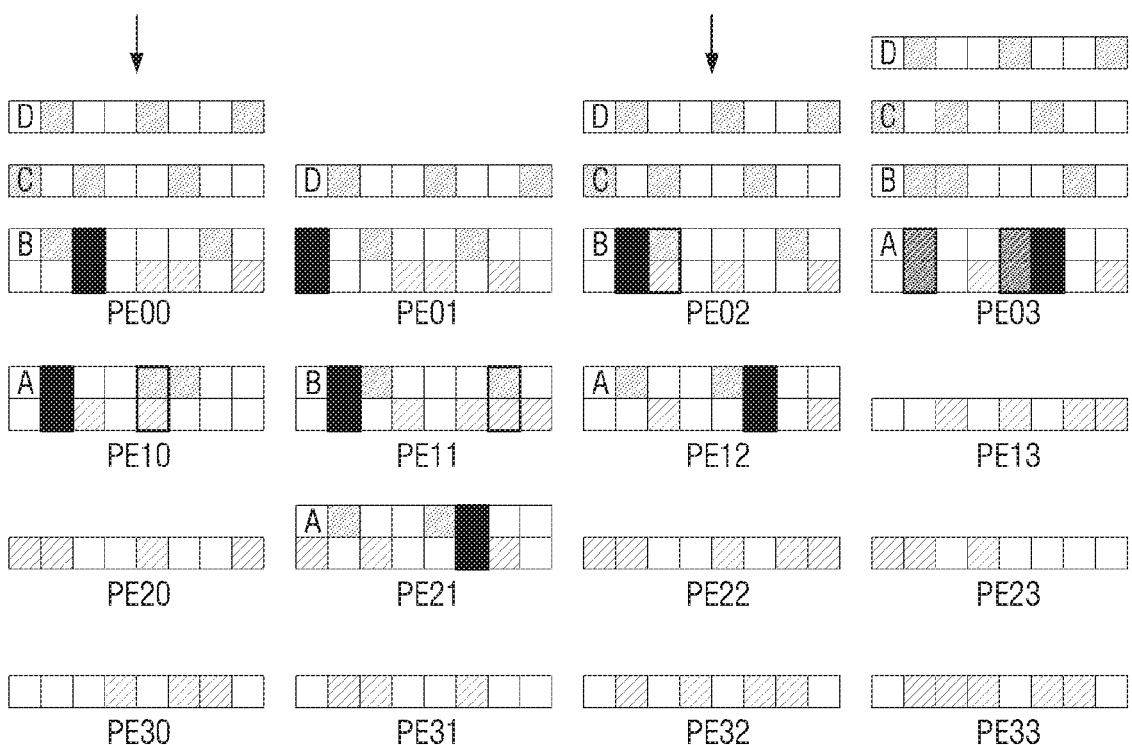
Figure 15D:
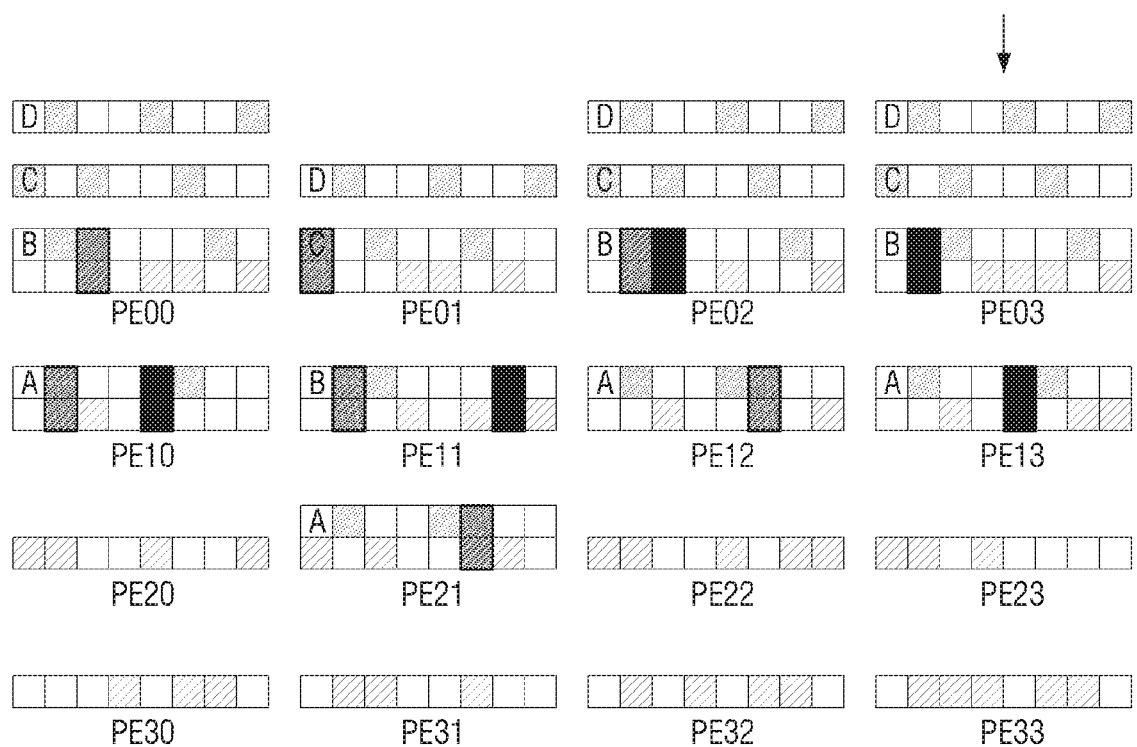
Figure 15E:
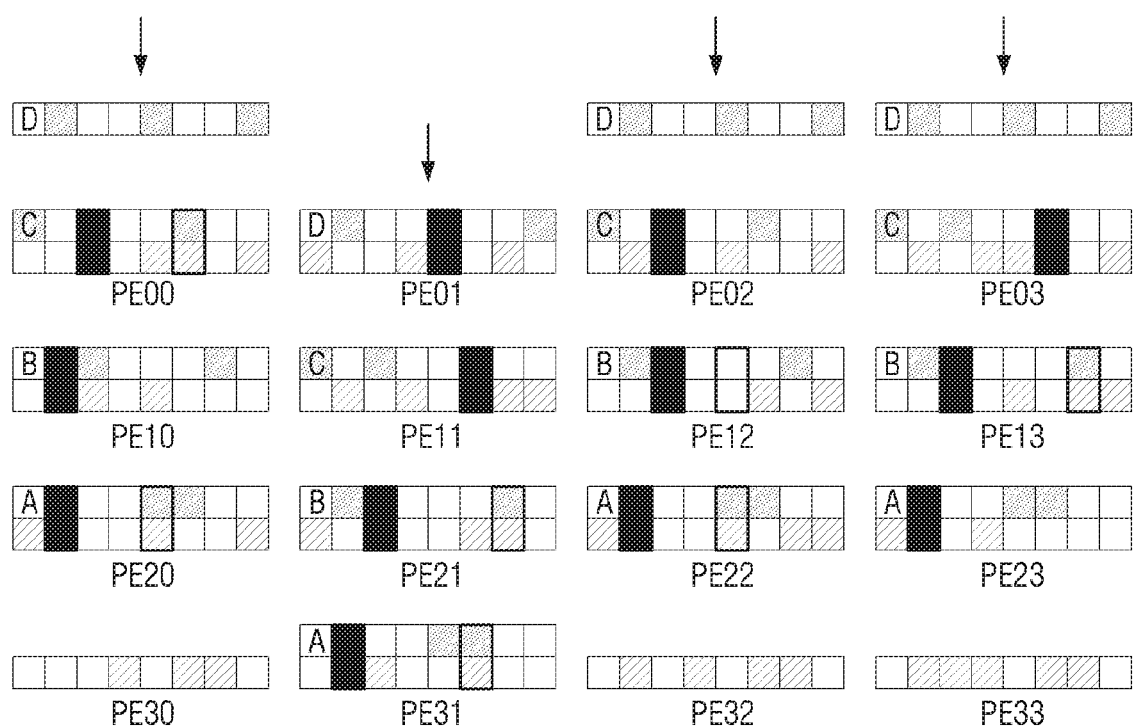
Figure 15F:
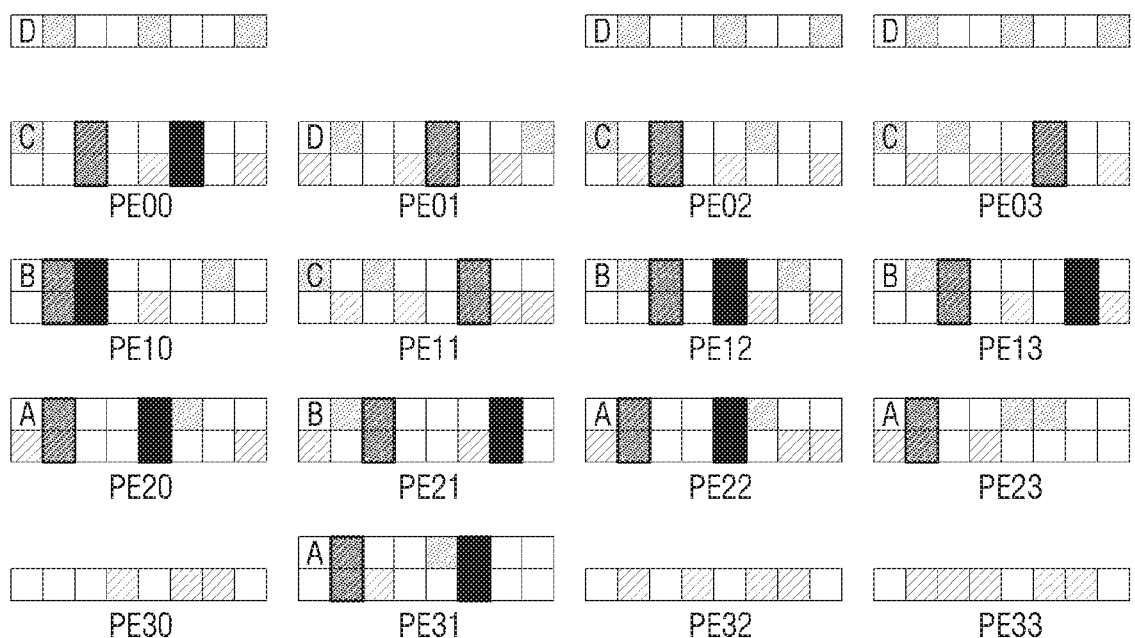
Figure 15G:
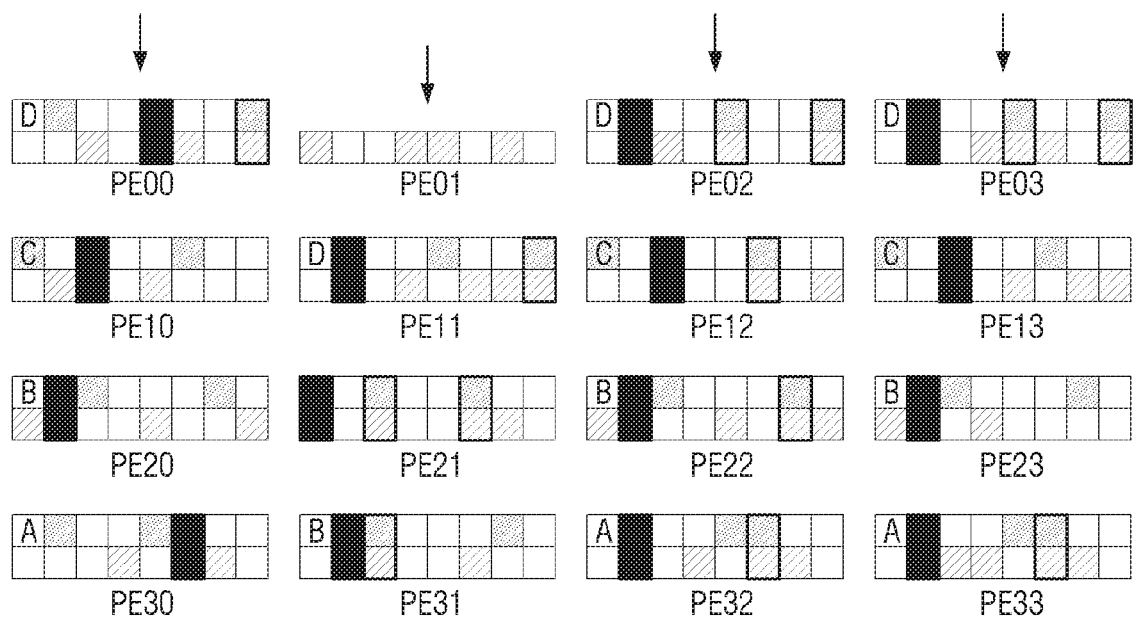
Figure 15H:
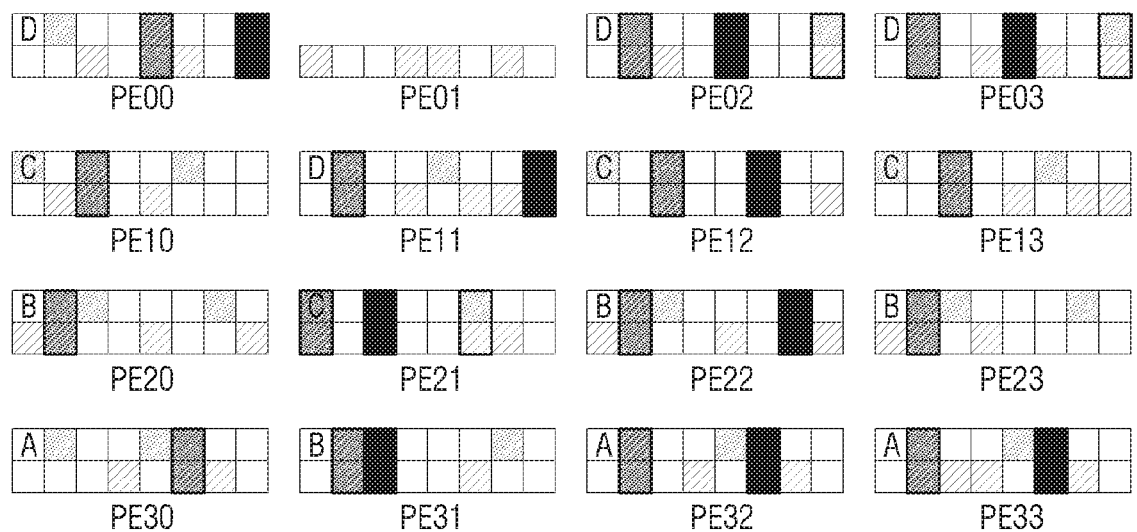
Figure 15I:
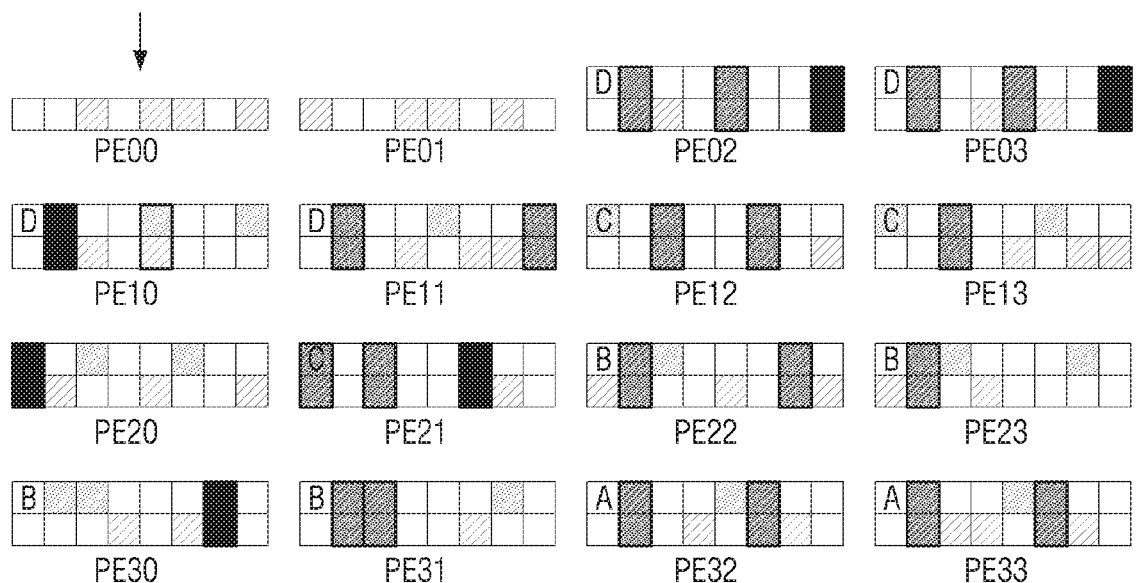
Figure 15J:
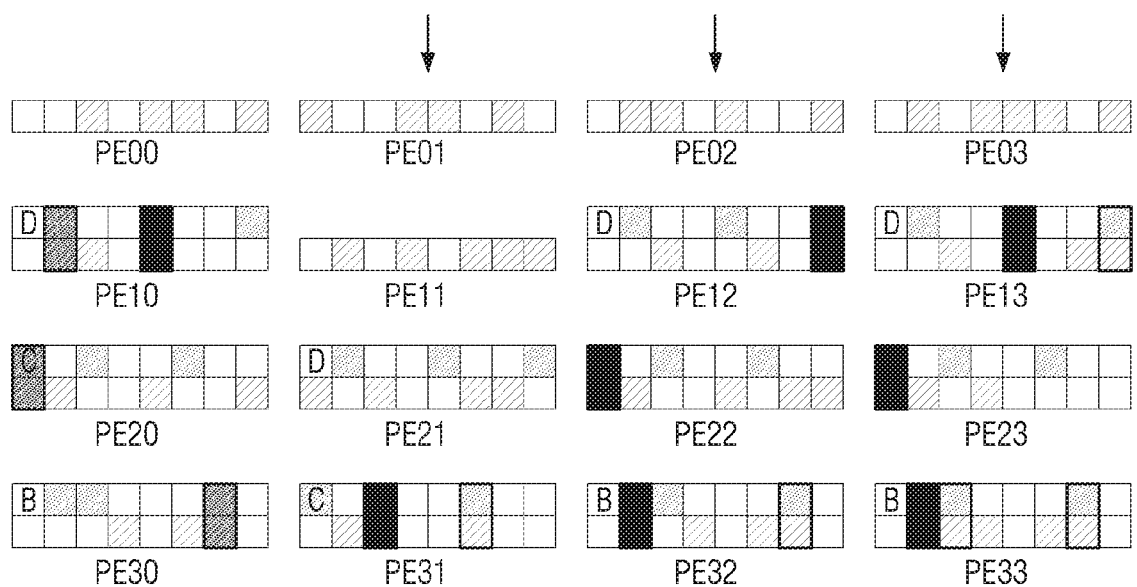
Figure 15K:
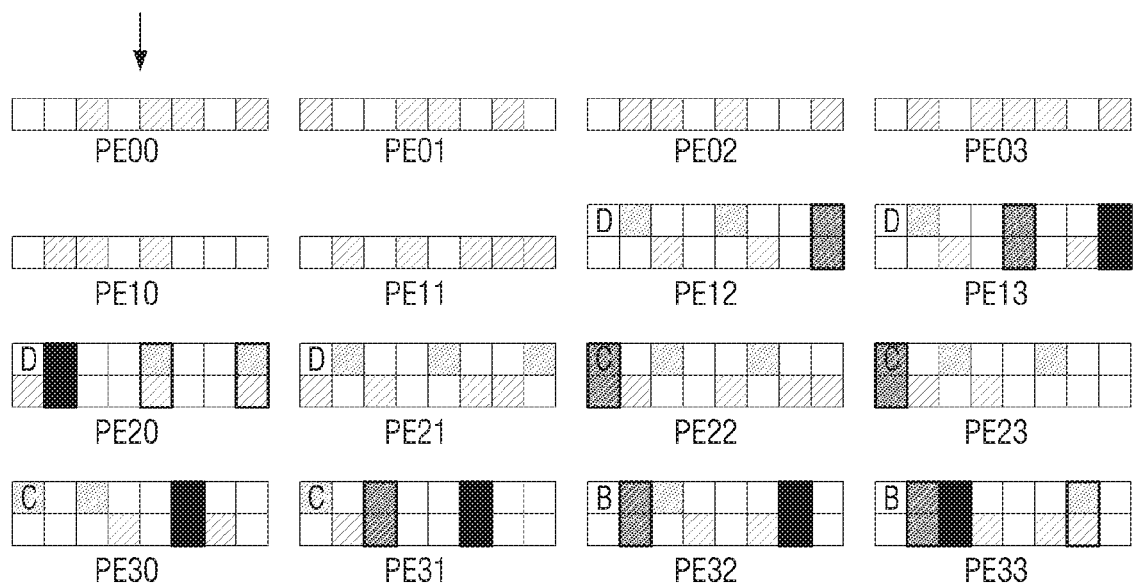
Figure 15L:
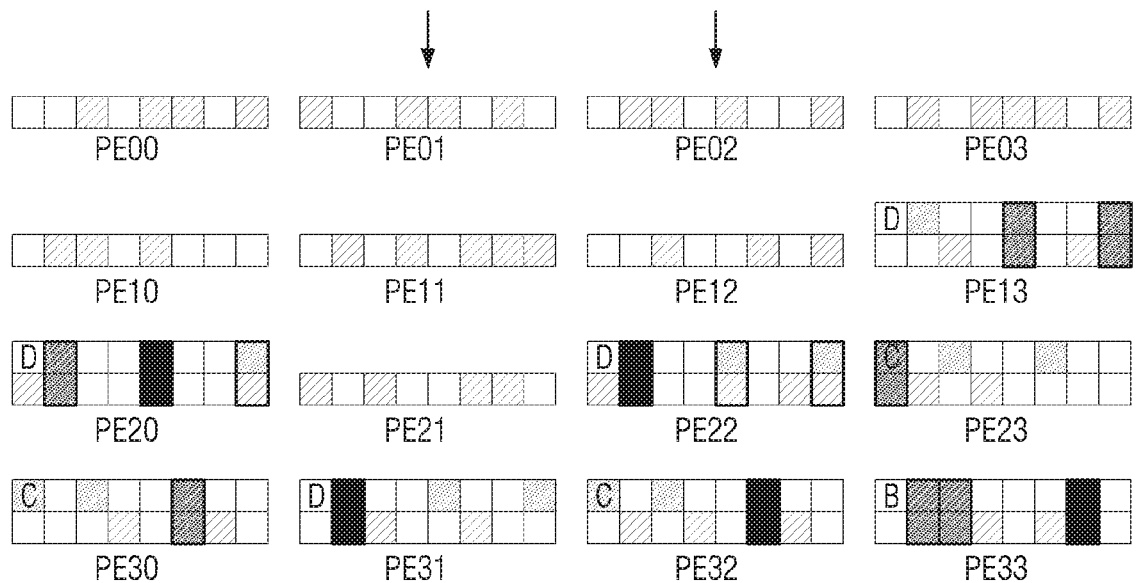
Figure 15M:
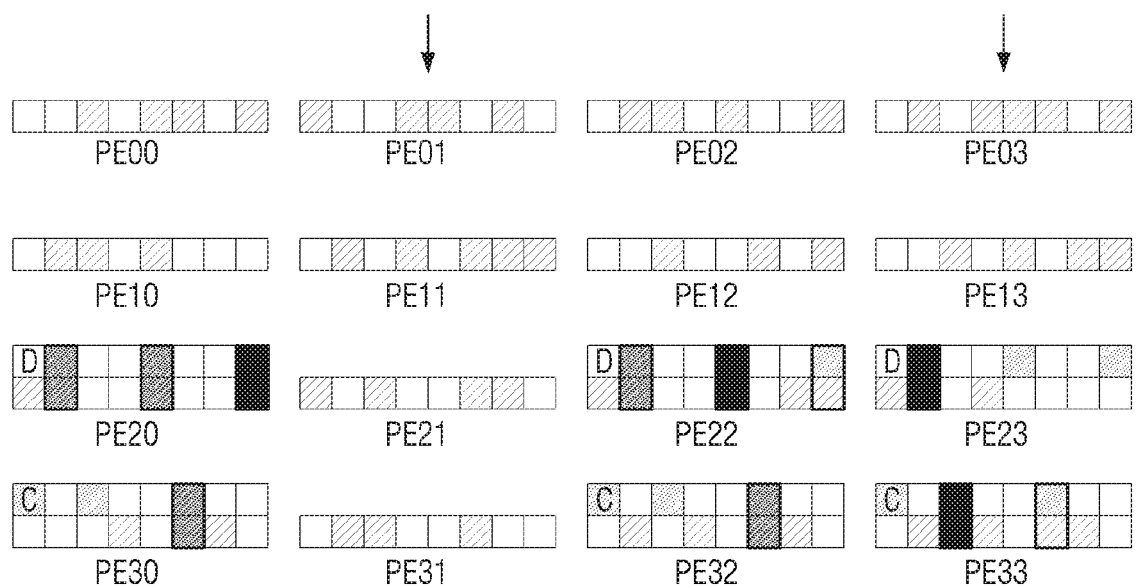
Figure 15N:
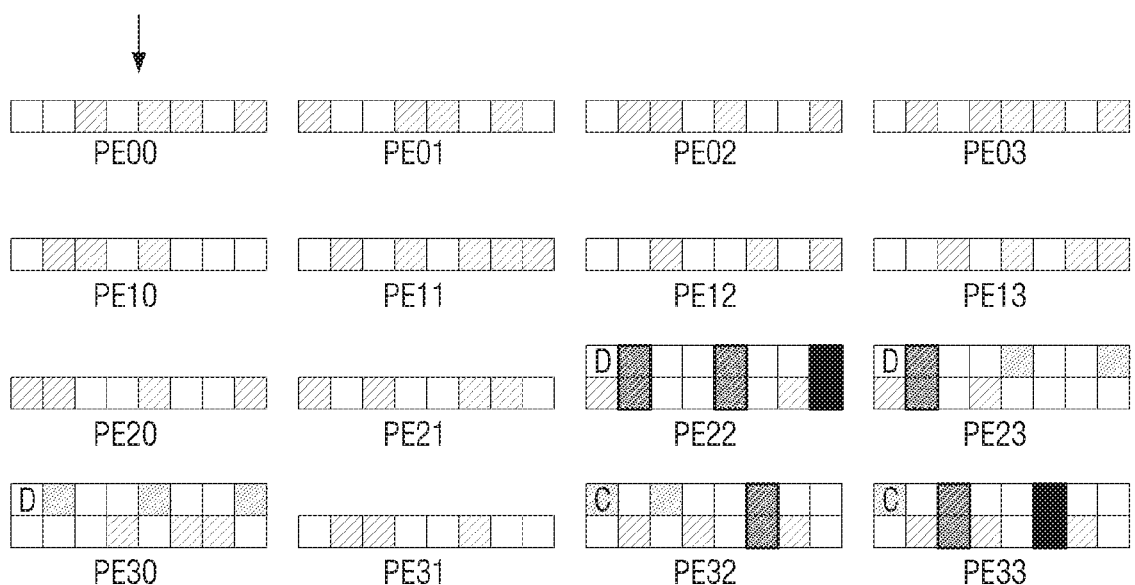
Figure 15O:
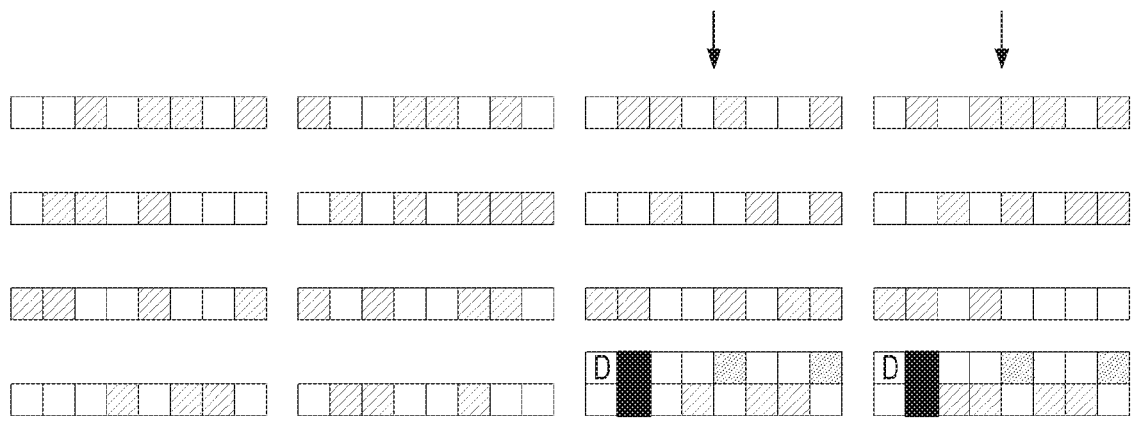

FIGS. 15A to 15O are views to explain the cycle-based operations of a plurality of processing elements according to another embodiment.

As described above with reference to FIGS. 12A to 12H, the first element of object data may be stored in each of the plurality of processing elements, and second elements A to D constituting kernel data may be sequentially input into the plurality of processing elements.

In addition, the first element stored in each of the plurality of processing elements, and second elements A to D respectively input to the plurality of processing elements may pass through the AND gate, and only the first and second non-zero elements corresponding to the depth in which the first element and the second element A have a non-zero value may be input into the calculator 30. Then, a convolution operation may be performed as described above with reference to FIGS. 12A to 12H.

FIGS. 15A to 15O show steps 1 (S1) to step 15 (S15) of processing operations of a plurality of processing elements by inputting the second elements A to D of the kernel data sequentially. However, unlike what is shown in FIGS. 12A to 12H, in order to facilitate the understanding of the explanation, the operation process of a plurality of processing elements is divided into cycles and shown for each step.

FIG. 15A shows that an operation is performed by inputting, into the calculator 30, the first and second non-zero elements having a non-zero value in the same depth among the first elements stored in each of the first buffers 10 of PE00 to PE03, and the second elements A stored in each of the second buffers 40 of PE00 to PE03. As described above, the PE controller 20 included in each of PE00 to PE03 may identify the first and second non-zero elements having a non-zero value in the same depth among the first elements and the second elements A through a logic circuit.

Referring to FIG. 15A, an operation between the second element A and the fifth element (or fifth sub-element, position or depth) of the first element (element having the depth of 5) may be performed in PE00 at step 1 (the first cycle).

An operation between the second element A and the third element of the first element may be performed in PE01.

An operation between the second element A and the second element of the first element may be performed in PE02.

An operation between the second element A and the second element of the first element may be performed in PE03.

Referring to FIG. 15B, an operation between the second element A and the sixth element of the first element (element having the depth of 6) may be performed in PE00 at step 2 (the second cycle).

Since the operation at the second column is completed at step S1, the PE controller 20 of PE01 may transmit a signal notifying that the operation by the second element A is competed to the second controller 122-2. The second controller 122-2 may store the second element B in the second buffer 40 of PE01. The PE controller 20 may input the second element B stored in the second buffer 40 and the first element stored in the first buffer 10 into the AND gate, and identify the first and second non-zero elements having a non-zero value in the same depth in first and second elements. The PE controller 20 may input the identified first and second non-zero elements into the calculator 30 and perform an operation.

Referring to FIG. 15B, an operation between the second element B and the seventh element of the first element may be performed in PE01.

The second controller 122-2 may store the second element A and the bitmap corresponding to the second element A in the second buffer 40 of PE11, and perform an operation between the first and second non-zero elements identified from the first element stored in the first buffer 10 and the second element A stored in the second buffer 40 in PE11.

An operation between the second element A and the sixth element of the first element may be performed in PE11.

An operation between the second element A and the fifth element of the first element may be performed in PE02.

An operation between the second element A and the fifth element of the first element may be performed in PE03.

Since the operation in the first column is completed at step 2, as shown in FIG. 15C, the second element B may be stored in the second buffer 40 of PE00 at step 3 (the third cycle), and an operation between the second element B and the third element of the first element may be performed.

The second element A may be stored in the second buffer 40, and an operation between the second element A and the second element of the first element may be performed in PE10.

Since the operation in the second column is completed at step 2, as shown in FIG. 15C, at step 3, the second element C may be stored in the second buffer 40 of PE01, the second element B may be stored in the second buffer 40 of PE11, and the second element A may be stored in the second buffer 40 of PE21.

Referring to FIG. 15C, an operation between the second element C and the first element of the first element may be performed in PE01.

An operation between the second element B and the second element of the first element may be performed in PE11.

An operation between the second element A and the sixth element of the first element may be performed in PE21.

In addition, since the operation in the third column is completed at step 2, as shown in FIG. 15C, the second element B may be stored in the second buffer 40 of PE02, and the second element A may be stored in the second buffer 40 of PE12 at step 3.

As shown in FIG. 15C, an operation between the second element B and the second element of the first element may be performed in PE02.

An operation between the second element A and the sixth element of the first element may be performed in PE12.

An operation between the second element A and the sixth element of the first element may be performed in PE03.

As shown in FIG. 15D, an operation between the second element A and the fifth element of the first element may be performed in PE10 at step 4 (the fourth cycle). An operation may not be performed in PE00.

An operation between the second element B and the seventh element of the first element may be performed in PE11. An operation may not be performed in PE01 and PE21.

An operation between the second element B and the third element of the first element may be performed in PE02. An operation may not be performed in PE12.

An operation between the second element B and the second element of the first element may be performed in PE03.

An operation between the second element A and the fifth element of the first element may be performed in PE13.

Since the operations in the first column to the fourth column are all completed at step 4, as shown in FIG. 15E, the second element C may be stored in the second buffer 40 of PE00, the second element B may be stored in the second buffer 40 of PE10, and the second element A may be stored in the second buffer 40 of PE20 at step 5 (the fifth cycle).

An operation between the second element C and the third element of the first element may be performed in PE00.

An operation between the second element B and the second element of the first element may be performed in PE10.

An operation between the second element A and the second element of the first element may be performed in PE20.

In addition, at step 5, the second element D may be stored in the second buffer 40 of PE01, the second element C may be stored in the second buffer 40 of PE11, the second element B may be stored in the second buffer 40 of PE21, and the second element A may be stored in the second buffer 40 of PE31.

An operation between the second element D and the fifth element of the first element may be performed in PE01.

An operation between the second element C and the sixth element of the first element may be performed in PE11.

An operation between the second element B and the third element of the first element may be performed in PE21.

An operation between the second element A and the second element of the first element may be performed in PE31.

In addition, at step 5, the second element C may be stored in the second buffer 40 of PE02, the second element B may be stored in the second buffer 40 of PE12, and the second element A may be stored in the second buffer 40 of PE22.

An operation between the second element C and the third element of the first element may be performed in PE02.

An operation between the second element B and the third element of the first element may be performed in PE12.

An operation between the second element A and the first element of the first element may be performed in PE22.

In addition, at step 5, the second element C may be stored in the second buffer 40 of PE03, the second element B may be stored in the second buffer 40 of PE13, and the second element A may be stored in the second buffer 40 of PE23.

An operation between the second element C and the sixth element of the first element may be performed in PE03.

An operation between the second element B and the third element of the first element may be performed in PE13.

An operation between the second element A and the second element of the first element may be performed in PE23.

As shown in FIG. 15F, an operation between the second element C and the sixth element of the first element may be performed in PE00 at step 6 (the sixth cycle).

An operation between the second element B and the third element of the first element may be performed in PE10.

An operation between the second element A and the fifth element of the first element may be performed in PE20.

An operation between the second element B and the seventh element of the first element may be performed in PE21.

An operation between the second element A and the sixth element of the first element may be performed in PE31. An operation may not be performed in PE01 and PE11.

An operation between the second element B and the fifth element of the first element may be performed in PE12.

An operation between the second element A and the fifth element of the first element may be performed in PE22. An operation may not be performed in PE02.

An operation between the second element B and the seventh element of the first element may be performed in PE13. An operation may not be performed in PE03 and PE23.

Since the operations in the first column to the fourth column are all completed, as shown in FIG. 15G at step 6, the second element D may be stored in the second buffer 40 of PE00, the second element C may be stored in the second buffer 40 of PE10, the second element B may be stored in the second buffer 40 of PE20, and the second element A may be stored in the second buffer 40 of PE30 at step 7.

An operation between the second element D and the fifth element of the first element may be performed in PE00.

An operation between the second element C and the third element of the first element may be performed in PE10.

An operation between the second element B and the second element of the first element may be performed in PE20.

An operation between the second element A and the sixth element of the first element may be performed in PE30.

A step 7, the second element D may be stored in the second buffer 40 of PE11, the second element C may be stored in the second buffer 40 of PE21, and the second element B may be stored in the second buffer 40 of PE31.

An operation between the second element D and the second element of the first element may be performed in PE11.

An operation between the second element C and the first element of the first element may be performed in PE21.

An operation between the second element B and the second element of the first element may be performed in PE31.

At step 7, the second element D may be stored in the second buffer 40 of PE02, the second element C may be stored in the second buffer 40 of PE12, the second element B may be stored in the second buffer 40 of PE22, and the second element A may be stored in the second buffer 40 of PE32.

An operation between the second element D and the second element of the first element may be performed in PE02.

An operation between the second element C and the third element of the first element may be performed in PE12.

An operation between the second element B and the second element of the first element may be performed in PE22.

An operation between the second element A and the second element of the first element may be performed in PE32.

At step 7, the second element D may be stored in the second buffer 40 of PE03, the second element C may be stored in the second buffer 40 of PE13, the second element B may be stored in the second buffer 40 of PE23, and the second element A may be stored in the second buffer 40 of PE33.

An operation between the second element D and the second element of the first element may be performed in PE03.

An operation between the second element C and the third element of the first element may be performed in PE13.

An operation between the second element B and the second element of the first element may be performed in PE23.

An operation between the second element A and the second element of the first element may be performed in PE33.

As shown in FIG. 15H, an operation between the second element D and the eighth element of the first element may be performed in PE00 at step 8 (the eighth cycle). An operation may not be performed in PE10, PE20, and PE30.

An operation between the second element D and the eighth element of the first element may be performed in PE11.

An operation between the second element B and the third element of the first element may be performed in PE21.

An operation between the second element A and the third element of the first element may be performed in PE31.

An operation between the second element D and the fifth element of the first element may be performed in PE02.

An operation between the second element C and the sixth element of the first element may be performed in PE12.

An operation between the second element B and the seventh element of the first element may be performed in PE22.

An operation between the second element A and the sixth element of the first element may be performed in PE32.

An operation between the second element D and the fifth element of the first element may be performed in PE03.

An operation between the second element A and the sixth element of the first element may be performed in PE33. An operation may not be performed in PE13 and PE23.

At step 8, since the operation is completed in the first column, as shown in FIG. 15I, the second element D may be stored in the second buffer 40 of PE10, the second element C may be stored in the second buffer 40 of PE20, and the second element B may be stored in the second buffer 40 of PE30 at step 9 (the ninth cycle).

An operation between the second element D and the second element of the first element may be performed in PE10.

An operation between the second element C and the first element of the first element may be performed in PE20.

An operation between the second element B and the seventh element of the first element may be performed in PE30.

An operation between the second element C and the sixth element of the first element may be performed in PE21. An operation may not be performed in PE11 and PE31.

An operation between the second element D and the eighth element of the first element may be performed in PE02. An operation may not be performed in PE12, PE22, and PE32.

An operation may be performed between the second element D and the eighth element of the first element in PE03. An operation may not be performed in PE13, PE23, and PE33.

Since the operations in the second column to the fourth column are all completed at step 9, as shown in FIG. 15J, the second element D may be stored in the second buffer 40 of PE21, and the second element C may be stored in the second buffer 40 of PE31 at step 10 (the tenth cycle).

In PE21, an operation may not be performed since there is no-zero element that can be operated in the same depth of the second element D and the first element.

In PE31, an operation may be performed between the second element C and the third element of the first element.

At step 10, the second element D may be stored in the second buffer 40 of PE12, the second element C may be stored in the second buffer 40 of PE22, and the second element B may be stored in the second buffer 40 of PE32.

An operation may be performed between the second element D and the eighth element of the first element in PE12.

An operation may be performed between the second element C and the first element of the first element in PE22.

An operation may be performed between the second element B and the second element of the first element in PE32.

At step 10, the second element D may be stored in the second buffer 40 of PE13, the second element C may be stored in the second buffer 40 of PE23, and the second element B may be stored in the second buffer 40 of PE33.

An operation may be performed between the second element D and the fifth element of the first element in PE13.

An operation may be performed between the second element C and the first element of the first element in PE23.

An operation may be performed between the second element B and the second element of the first element in PE33.

At step 10, since the operation in the first column is completed, as shown in FIG. 15K, the second element D may be stored in the second buffer 40 of PE20, and the second element C may be stored in the second buffer 40 of PE30 at step 11 (the eleventh cycle).

An operation may be performed between the second element D and the second element of the first element in PE20.

An operation may be performed between the second element C and the sixth element of the first element in PE30.

An operation may be performed between the second element C and the sixth element of the first element in PE31. An operation may be performed in PE21.

An operation may be performed between the second element B and the seventh element of the first element in PE32. An operation may not be performed in PE12 and PE22.

An operation may be performed between the second element D and the eighth element of the first element in PE13.

An operation may be performed between the second element B and the third element of the first element in PE33. An operation may not be performed in PE23.

Since the operations in the second column and the third column are completed at step 11, as shown in FIG. 15I, the second element D may be stored in the second buffer 40 of PE31, the second element D may be stored in the second buffer 40 of PE22, and the second element C may be stored in the second buffer 40 of PE32 at step 12 (the twelfth cycle).

An operation may be performed between the second element D and the second element of the first element in PE31.

An operation may be performed between the second element D and the second element of the first element in PE22.

An operation may be performed between the second element C and the sixth element of the first element in PE32.

An operation may be performed between the second element B and the seventh element of the first element in PE33. An operation may not be performed in PE13 and PE23.

Since the operations in the second column and the fourth column are all completed at step 12, as shown in FIG. 15M, the second element D may be stored in the second buffer 40 of PE23, and the second element C may be stored in the second buffer 40 of PE33 at step 13 (the thirteenth cycle). All operations may be completed by the first kernel in the processing elements PE01, PE11, PE21 and PE31 in the second column.

An operation may be performed between the second element D and the second element of the first element in PE23.

An operation may be performed between the second element C and the third element of the first element in PE33.

An operation may be performed between the second element D and the eighth element of the first element in PE20. An operation may not be performed in PE30.

An operation may be performed between the second element D and the fifth element of the first element in PE22. An operation may not be performed in PE32.

Since the operations in the first column are all completed at step 13, as shown in FIG. 15N, the second element D may be stored in the second buffer 40 of PE30 at step 14 (the fourteenth cycle).

Since there is no non-zero element that can be operated in the same depth of the second element D and the first element in PE30, an operation may not be performed.

An operation may be performed between the second element D and the eighth element of the first element in PE22. An operation may not be performed in PE32.

An operation may be performed between the second element C and the sixth element of the first element in PE33. An operation may not be performed in PE23.

Since the operations in the first column, the third column and the fourth column are all completed at step 14, as shown in FIG. 15O, the second element D may be stored in the second buffer 40 of PE32, and the second element D may be stored in the second buffer 40 of PE33 at step 15 (the fifteenth cycle).

An operation may be performed between the second element D and the second element of the first element in PE32.

An operation may be performed between the second element D and the second element of the first element in PE33.

According the second example embodiment, the total number of cycles required for the operations on kernel data and object data may be 15 cycles. This is reduced by two cycles from the total number of cycles required for the operations in the first example embodiment. Therefore, according to the second example embodiment, the operation performance may be increased by independently controlling the processing elements by column of the plurality of processing elements 121-1 to 121-$n$.

The Third Example Embodiment

Figure 16A:
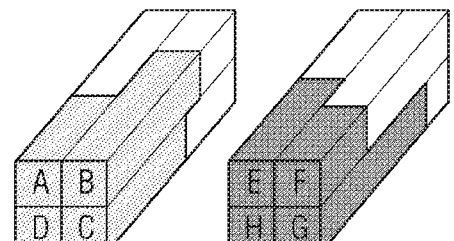
FIGS. 16A and 16B are views to explain a method for storing object data and kernel data according to another embodiment.
Figure 16A:
Figure 16A:
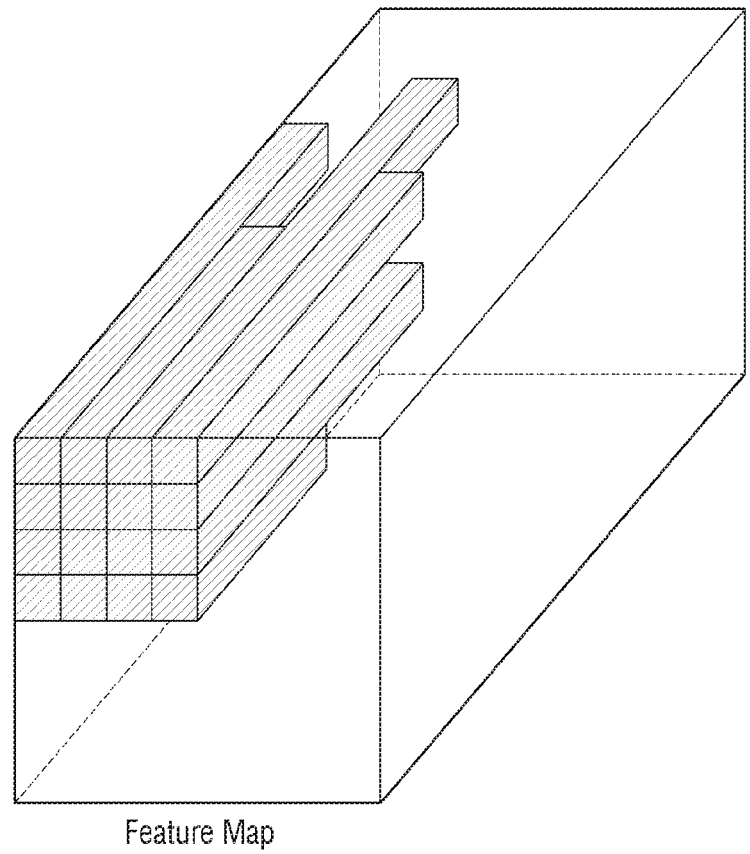
Figure 16B:
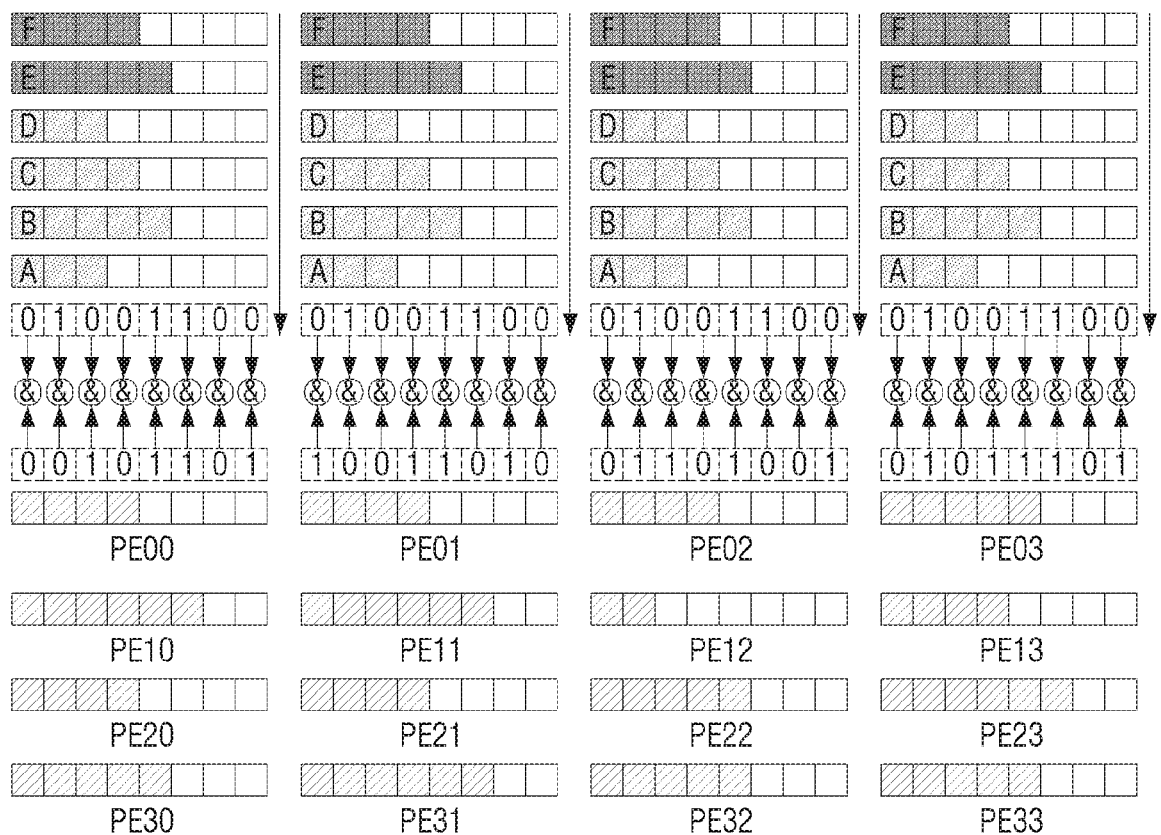

FIGS. 16A and 16B are views to explain a method for storing object data and kernel data according to another embodiment.

The kernel data and the object data may be data compressed in the depth direction by removing a zero element. FIG. 16A is a schematic diagram showing the kernel data and the object data.

Accordingly, FIG. 16B shows the first elements of the object data stored in the first buffers 10 of the plurality of processing elements 121-1 to 121-$n$, and the second elements of the kernel data, which are sequentially input into the second buffers 40 of the plurality of processing elements 121-1 to 121-$n$.

The first bitmaps indicating that the first elements before compression (i.e., original data of the compressed first elements) are zero or non-zero by depth may be stored in the first buffers 10 of the plurality of processing elements 121-1 to 121-$n$, and the second bitmaps indicating that the second elements before compression (i.e., original data of the compressed second elements) are zero or non-zero by depth may be stored in the second buffers 40 of the plurality of processing elements 121-1 to 121-$n$.

Referring to FIG. 16B, each of the plurality of controllers 122-1 to 122-4 may store the compressed second element A constituting or of a first kernel and a second bitmap of the second element A in the second buffer 40 included in each of the first processing elements in the first row, and input the bitmaps (i.e., the first bitmaps) of the first elements stored in the first buffers 10 of the first processing elements PE00 to PE33 and the bitmap "01001100" (i.e., the second bitmap) of the second element A stored in the second buffer 40 into the PE controller 20 included in each of the plurality of processing elements PE00 to PE03. The PE controller 20 may include a logic circuit, and the logic circuit may be embodied as the AND gate as in the above-described embodiment.

The first and second bitmaps may be input into the AND gate included in the PE controller 20, and a plurality of AND gates included in the first processing elements PE00 to PE03 may compare the second bitmap "01001100" with the first bitmaps "00101101," "10011010," "01101001," and "01011101," and identify the depths in which the first and second elements all have nonzero values. The PE controller 20 may load the compressed first and second elements corresponding to the depth identified from the first buffer 10 and the second buffer 40 and output the compressed first and second elements to the calculator 30 included in each of the first processing elements PE00 to PE03.

Since the position of the value "1" in the first and second bitmaps indicates the position of the element, the PE controller 20 may identify first and second elements to perform the operation among the compressed first and second elements based on the position of "1" in the first and second bitmaps.

Figure 17:
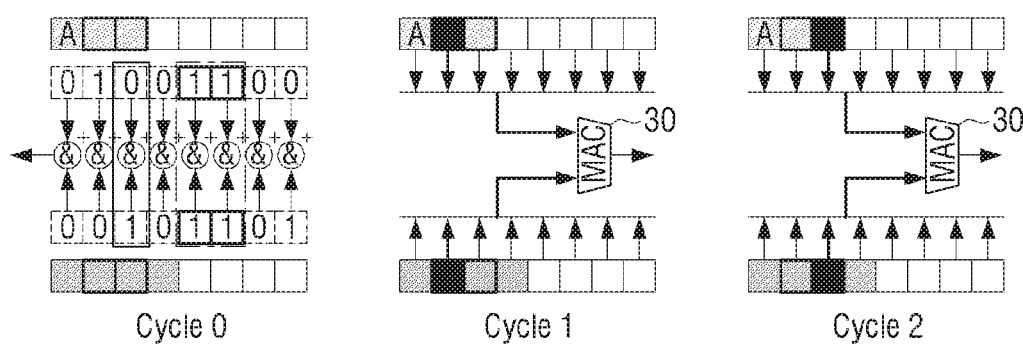
FIG. 17 is a view to explain an operation method for object data and kernel data according to another embodiment.

Referring to FIG. 17, the AND gate may compare the first and second bitmaps, indicating that the fifth and sixth data (i.e., the data in the fifth and sixth positions from the left) in the first and second bitmap arrays represent a non-zero element. The fifth and sixth data in the first bitmap may correspond to the second and third data "1," respectively, and the fifth and sixth data in the second bitmap may also correspond to the second and third data "1."

Therefore, the second and third elements may have a non-zero value in the first and second elements. The PE controller 20 may sequentially input the second and third elements into the calculator 30 in the first and second elements and perform an operation as shown in FIG. 17.

Figure 18:
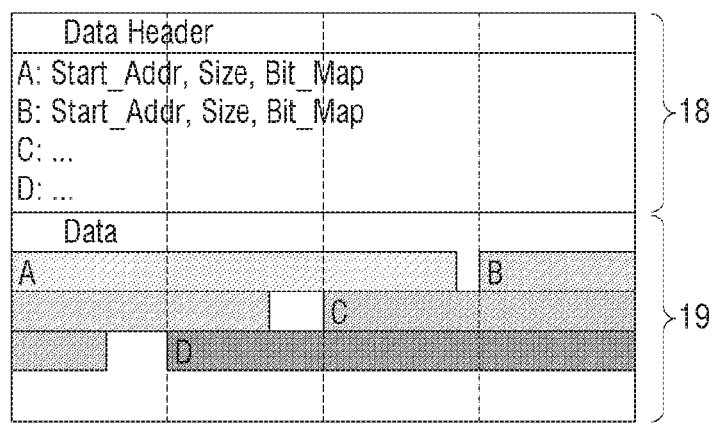
FIG. 18 is a view to explain a storage format of object data and kernel data according to another embodiment.

FIG. 18 is a view to explain a storage format of object data and kernel data according to an embodiment.

Referring to FIG. 18, a storage 110 that stores object data and kernel data according to the present embodiment may consist of or include a header area 18 and a data area 19. The header area 18 may store header files for elements A to D forming at least one kernel, and data stored in each header file may include the start addresses (Start_Addr) indicating the locations of the second elements A to D in the data area 19, and the sizes (Size) of the second elements A to D, and the bitmaps (Bit_Map) of the second elements A to D In the same manner, the header area 18 may include a header file including the start address, the size and the bitmap in the data area 19 of the first element of object data.

The data area 19 may include object data and kernel data in the structure as shown in FIG. 18.

Figure 19:
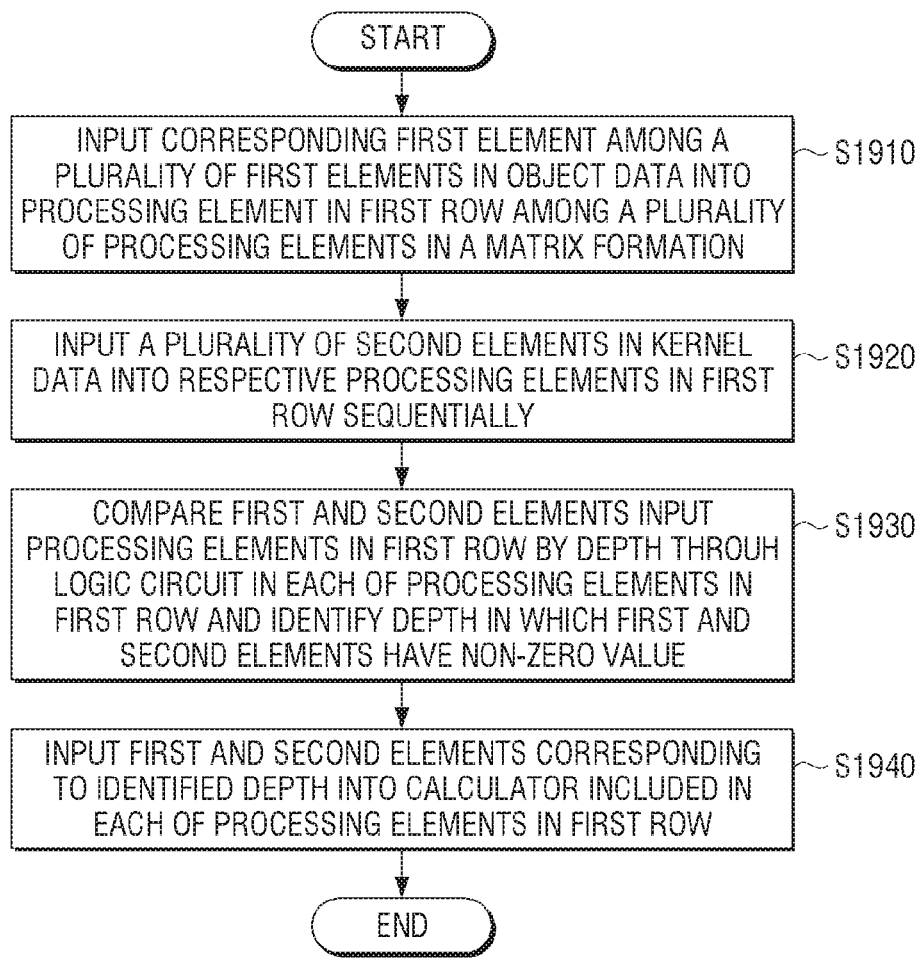
FIG. 19 is a schematic flowchart to explain a method for controlling an electronic apparatus according to an embodiment.

FIG. 19 is a schematic flowchart to explain a method for controlling an electronic apparatus according to an embodiment.

Corresponding first elements among a plurality of first elements included in object data may be input to processing elements arranged in the first row among a plurality of processing elements arranged in a matrix formation at step S1910.

A plurality of second elements included in kernel data may be sequentially input to processing elements arranged in the first row at step S1920.

A depth in which first and second elements have a non-zero value may be identified by comparing the first and second elements input to the processing elements in the first row by depth through a logic circuit included in each processing element in the first row at step S1930.

The plurality of processing elements may store the first and second elements input to the plurality of processing elements and first and second bitmaps respectively indicating whether the first and second elements are zero or non-zero by depth. Depths in which the input first and second elements have a non-zero value may be identified by comparing the first bitmap with the second bitmap through a logic circuit included in each of the plurality of processing elements.

To be specific, the positions of the value "1" on the respective arrays of the first and second bitmaps may be compared through the logic circuit included in each of the plurality of processing elements, and when the first and second bitmaps have the value "1" at the same position, the depth in the same position of the input first and second elements may be identified.

The logic circuit included in each of the plurality of processing elements may include more logic gates than the number of bits of the first and second bitmaps. The positions of the value "1" on the respective arrays of the first and second bitmaps may be compared by inputting the value in the same position on the respective arrays in the first and second bitmaps into a logic gate. The logic gate may be a gate for performing the AND operation, and may identify a depth corresponding to the position on the array in which the resultant value of the AND operation of the logic data in the first and second elements is "1."

A convolution operation may be performed by inputting the first and second elements corresponding to the identified depth into the calculator included in each processing element in the first row at step S1940.

When the operation by the input second element is completed in the processing element in the first row, another second element among a plurality of second elements may be input to the processing element in the first row.

By comparing the first and second elements respectively input to the processing elements in the second row through the logic circuit included in each processing element in the second row by depth, a depth in which the first and second elements have a non-zero value may be identified, and a convolution operation may be performed by inputting the first and second elements corresponding to the identified depth into the calculator included in each of the processing elements in the second row.

The convolution operation may be performed in a way of performing accumulation on an operation value between neighboring processing elements by shifting the operation value obtained by multiplying the first and second non-zero elements having the same depth in the input first and second elements to the neighboring processing elements in the row direction.

As described above, according to various embodiments, an electronic apparatus may improve the convolution operation speed by omitting the operation of a part of the object data and a part of the kernel data according to 0 (zero) included in the object data and the kernel, and remarkably reduce the bottleneck due to data loading by compressing the object data and the kernel data.

As described above, the object data and the kernel data could be any type of three-dimensional data. In addition, the number of a plurality of processing elements included in the processor may vary in various embodiments.

The various embodiments described above may be implemented in a recording medium that can be read by a computer or a similar device using software, hardware, or a combination thereof, e.g., a non-transitory computer readable recording medium. In some cases, embodiments described herein may be implemented by a processor itself. According to software implementations, embodiments such as the procedures and functions described herein may be implemented in separate software modules. According to some embodiments, software may contain one or more instructions that are stored in a machine readable storage medium or external memory. Each of the software modules may perform one or more of the functions and operations described herein.

A controlling method for an electronic apparatus according to various example embodiments as described above may be embodied as a program and stored in one or more of various types of recording media. In other words, a computer program that can be processed by various processors to execute a controlling method for the above-described electronic apparatuses may be stored in a recording medium for use.

For example, a non-transitory computer readable medium that stores a program for performing a controlling operation including inputting corresponding first elements among a plurality of first elements include in object data into processing elements in the first row of a plurality of processing elements in a matrix formation, inputting a plurality of second elements included in kernel data into the processing elements in the first row sequentially, identifying a depth in which the first and second elements have a non-zero value by comparing the first and second elements input to the processing elements in the first row by depth, and performing a convolution operation by inputting first and second elements corresponding to the identified depth into a calculator included in each of the processing elements in the first row.

The non-transitory computer readable medium refers to a medium that stores data semi-permanently rather than storing data for a very short time, such as a register, a cache, and a memory, and is readable by an apparatus. Specifically, the above-described various applications or programs may be stored in a non-transitory computer readable medium such as a compact disc (CD), a digital versatile disk (DVD), a hard disk, a Blu-ray disk, a universal serial bus (USB) memory stick, a memory card, and a read only memory (ROM).

Although certain embodiments have been shown and described above, it will be appreciated by those skilled in the art that changes may be made to these embodiments without departing from the principles and spirit of the disclosure. Accordingly, the scope of the disclosure is not construed as being limited to the described embodiments, but is defined by the appended claims as well as equivalents thereto.

What is claimed is:

1. An electronic apparatus, comprising:
a storage configured to store object data and kernel data; and
a processor comprising a plurality of processing elements arranged in a matrix formation,
wherein the processor is configured to:
input corresponding first elements, among a plurality of first elements included in the object data, respectively into processing elements arranged in a first row among the plurality of processing elements,
input a plurality of second elements, included in the kernel data, sequentially into the processing elements arranged in the first row to perform operations between the corresponding first elements and the plurality of second elements,
compare, through a logic circuit included in each of the processing elements arranged in the first row, the corresponding first elements and the plurality of second elements input to the processing elements arranged in the first row by depth, the corresponding first elements and the plurality of second elements are composed of an equal number of plural depths,
identify a depth among the plural depths in which a first element and a second element, among the compared corresponding first elements and the plurality of second elements input to the processing elements arranged in the first row, have a non-zero value, and
input the first element and the second element corresponding to the identified depth into a calculator included in each of the processing elements arranged in the first row to perform a convolution operation,
wherein the processor is further configured to:
based on operations with respect to an input second element, among the plurality of second elements, being completed in the processing elements arranged in the first row, input another second element, among the plurality of second elements, into the processing elements arranged in the first row;
based on operations with respect to the input plurality of second elements being completed in the processing elements arranged in the first row, compare, through a logic circuit included in each of processing elements arranged in a second row, a corresponding first elements, among the plurality of first elements, and the plurality of second elements respectively input to the processing elements arranged in the second row by depth;
identify a depth in which a first element and a second element, among the compared corresponding first elements and the plurality of second elements input to the processing elements arranged in the second row, have a non-zero value; and
input the first element and the second element corresponding to the identified depth, among the compared corresponding first elements and the plurality of second elements input to the processing elements arranged in the second row, into a calculator included in each of the processing elements arranged in the second row to perform a convolution operation.

2. The electronic apparatus as claimed in claim 1, wherein:
the processor further comprises a controller configured to control the plurality of processing elements.

3. The electronic apparatus as claimed in claim 2, wherein the plurality of processing elements comprise:
a first buffer configured to store first elements input to the plurality of processing elements and a first bitmap indicating whether the input first elements are zero or non-zero by depth; and
a second buffer configured to store second elements input to the plurality of processing elements and a second bitmap indicating whether the input second element are zero or non-zero by depth, and
wherein the controller is further configured to compare, through the logic circuit included in each of the plurality of processing elements, the first bitmap and the second bitmap, and to identify a depth in which the input first elements and the input second elements have a non-zero value.

4. The electronic apparatus as claimed in claim 3, wherein the controller is further configured to compare, through the logic circuit included in each of the plurality of processing elements, positions of "1" on respective arrays of the first bitmap and the second bitmap, and based on "1" being at a same position of the respective arrays of the first bitmap and the second bitmap, identify a depth corresponding to the same position of the input first elements and the input second elements.

5. The electronic apparatus as claimed in claim 4, wherein:
the logic circuit included in each of the plurality of processing elements comprises a plurality of logic gates equal to or greater than a bit number of the first bitmap and the second bitmap; and
the controller is further configured to input a value in a same position on the respective arrays of the first bitmap and the second bitmap into a logic gate, and to compare the positions of "1" on the respective arrays of the first bitmap and the second bitmap.

6. The electronic apparatus as claimed in claim 5, wherein:
the logic gate is a gate for performing an AND operation; and
the controller is further configured to identify a depth corresponding to a position on an array in which a resultant value of the AND operation of the logic gate in the input first elements and the input second elements is "1".

7. The electronic apparatus as claimed in claim 1, wherein each of the processing elements arranged in the first row is configured to shift an operation value obtained by multiplying a first non-zero element by a second non-zero element, both of which have a same depth in the input corresponding first elements and the input plurality of second elements, to an adjacent processing element in a row direction, and to perform accumulation on operation values between adjacent processing elements.

8. The electronic apparatus as claimed in claim 1, wherein:
the processor further comprises a plurality of controllers for individually controlling the plurality of processing elements for each column; and each of the plurality of controllers is configured to, based on operations by the input plurality of second elements being completed in a processing element in one column among the processing elements arranged in the first row, input another second element among the plurality of second elements into a processing element in which the operations are completed.

9. The electronic apparatus as claimed in claim 8, wherein:
the input corresponding first elements and the input plurality of second elements are data compressed in a depth direction by removing a zero element; and
each of the plurality of controllers is further configured to, based on a first bitmap indicating whether a first element before compression is zero or non-zero by depth, and a second bitmap indicating whether a second element before compression is zero or non-zero by depth, identify a depth in which the first element and the second element before compression have a non-zero value, identify a first element and a second element corresponding to the identified depth from the compressed data, and input the identified first element and the identified second element into the calculator included in each of the processing elements arranged in the first row to perform the convolution operation.

10. A controlling method for an electronic apparatus comprising a storage for storing object data and kernel data, and a processor including a plurality of processing elements arranged in a matrix formation, the controlling method comprising:
inputting corresponding first elements, among a plurality of first elements included in the object data, respectively to processing elements arranged in a first row among the plurality of processing elements;
inputting a plurality of second elements, included in the kernel data, sequentially into the processing elements arranged in the first row;
comparing, through a logic circuit included in each of the processing elements arranged in the first row, the corresponding first elements with the plurality of second elements input to the processing elements arranged in the first row by depth, the corresponding first elements and the plurality of second elements are composed of an equal number of plural depths;
identifying a depth among the plural depths in which a first element and a second element, among the compared corresponding first elements and the plurality of second elements input to the processing elements arranged in the first row, have a non-zero value;
inputting the first element and the second element corresponding to the identified depth into a calculator included in each of the processing elements arranged in the first row to perform a convolution operation;
based on operations with respect to an input second element, among the plurality of second elements, being completed in the processing elements arranged in the first row, inputting another second element, among the plurality of second elements, into the processing elements arranged in the first row;
comparing, through a logic circuit included in each of processing elements arranged in a second row, corresponding first elements, among the plurality of first elements, and the plurality of second elements respectively input to the processing elements arranged in the second row by depth;
identifying a depth in which a first element and a second element, among the compared corresponding first elements and the plurality of second elements input to the processing elements arranged in the second row, have a non-zero value; and
inputting the first element and the second element corresponding to the identified depth, among the compared corresponding first elements and the plurality of second elements input to the processing elements arranged in the second row, into a calculator included in each of the processing elements arranged in the second row to perform a convolution operation.

11. The method as claimed in claim 10, wherein the plurality of processing elements comprise:
a first buffer configured to store first elements into to the plurality of processing elements and a first bitmap indicating whether the input first elements are zero or non-zero by depth; and
a second buffer configured to store second elements input to the plurality of processing elements, and a second bitmap indicating whether the input second elements are zero or non-zero by depth,
wherein the identifying comprises comparing, through the logic circuit included in each of the plurality of processing elements, the first bitmap with the second bitmap, and identifying a depth in which the input first elements and the input second elements have a non-zero value.

12. The method as claimed in claim 11, wherein the identifying further comprises comparing, through the logic circuit included in each of the plurality of processing elements, positions of "1" on respective arrays of the first bitmap and the second bitmap, and based on "1" being at a same position of the respective arrays of the first bitmap and the second bitmap, identifying a depth corresponding to the same position of the input first elements and the input second elements.

13. The method as claimed in claim 12, wherein:
the logic circuit included in each of the plurality of processing elements comprises a plurality of logic gates equal to or greater than a bit number of the first bitmap and the second bitmap; and
the identifying further comprises inputting a value in a same position on the respective arrays of the first bitmap and the second bitmap into a logic gate, and comparing the positions of "1" on the respective arrays of the first bitmap and the second bitmap.

14. The method as claimed in claim 13, wherein:
the logic gate is a gate to perform an AND operation; and
the identifying further comprises identifying a depth corresponding to a position on an array in which a resultant value of the AND operation of the logic gate in the input first elements and the input second elements is "1".

15. The method as claimed in claim 10, wherein the performing the convolution operation comprises shifting an operation value obtained by multiplying a first non-zero element by a second non-zero element, both of which have a same depth in the input corresponding first elements and the input plurality of second elements, to an adjacent processing element in a row direction, and performing accumulation on operation values between adjacent processing elements.

16. The method as claimed in claim 10, further comprising based on operations by the input plurality of second elements being completed in a processing element in one column among the processing elements arranged in the first row, inputting another second element among the plurality of second elements into a processing element in which the operations are completed.

17. The method as claimed in claim 16, wherein:
the input corresponding first elements and the input plurality of second elements are data compressed in a depth direction by removing a zero element; and
the identifying comprises, based on a first bitmap indicating whether a first element before compression is zero or non-zero by depth, and a second bitmap indicating whether a second element before compression is zero or non-zero by depth, identifying a depth in which the first element and the second element before compression have a non-zero value, and identifying a first element and a second element corresponding to the identified depth from the compressed data.

* * * * *